(12) United States Patent
Lautzenhiser

(10) Patent No.: US 6,771,133 B2
(45) Date of Patent: Aug. 3, 2004

(54) PHASE-LOCKED OSCILLATOR WITH IMPROVED DIGITAL INTEGRATOR

(75) Inventor: Lloyd L. Lautzenhiser, Sun Valley, NV (US)

(73) Assignee: Emhiser Research Limited, Parry Sound (CA)

(*) Notice: Subject to any disclaimer, the term of this patent is extended or adjusted under 35 U.S.C. 154(b) by 48 days.

(21) Appl. No.: 10/170,160

(22) Filed: Jun. 12, 2002

(65) Prior Publication Data

US 2002/0149503 A1 Oct. 17, 2002

Related U.S. Application Data

(60) Division of application No. 09/540,352, filed on Mar. 31, 2000, and a continuation-in-part of application No. 09/540,352, filed on Mar. 31, 2000, now Pat. No. 6,411,237, which is a continuation-in-part of application No. 09/353,406, filed on Jul. 15, 1999, now Pat. No. 6,417,738, which is a continuation-in-part of application No. 09/174,397, filed on Oct. 14, 1998, now abandoned.
(60) Provisional application No. 60/069,077, filed on Dec. 9, 1997, and provisional application No. 60/062,982, filed on Oct. 21, 1997.

(51) Int. Cl.$^7$ ............................ H03L 7/089; H03L 7/10; H03L 7/18

(52) U.S. Cl. ........................... 331/17; 331/1 A; 331/16; 331/23; 331/25; 327/156; 327/159

(58) Field of Search ......................... 331/17, 1 A, 10, 331/11, 16, 23, 25; 327/156, 157, 158, 159; 375/370; 455/260

(56) References Cited

U.S. PATENT DOCUMENTS

| 5,371,425 A | 12/1994 | Rogers |
| 6,133,770 A | * 10/2000 | Hasegawa .................. 327/156 |

* cited by examiner

Primary Examiner—Daniel Chang
(74) Attorney, Agent, or Firm—Wendell E. Miller, Patent Agent

(57) ABSTRACT

Phase-locked oscillators (74, 152, 172, or 196) include both a digital integrator (82 or 146) and a digital lead compensator (84, 148, or 180), and use either analog (108) or digital (184) summation of integration and lead-compensation signals to provide a lead-compensated digital integrator (86, 150, or 182). Preferably, integration and/or lead compensation includes decoding UP and DOWN signals into plus one, minus one, and/or zero signals. The phase-locked oscillators (74, 152, 172, or 196) may include one or more nonlinear digital-to-analog converters (282, 292, 310, 340, or 370) for digital-to-analog converting the digital phase-locking information and the digital lead-compensation information.

55 Claims, 11 Drawing Sheets

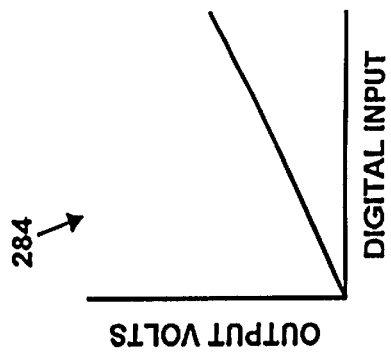
FIG. 14
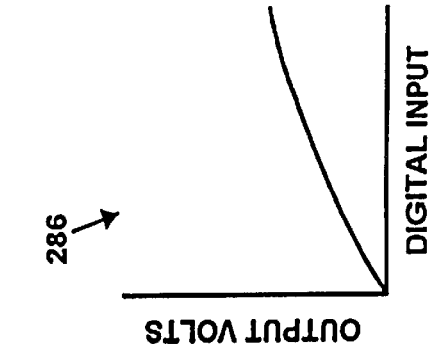
FIG. 15
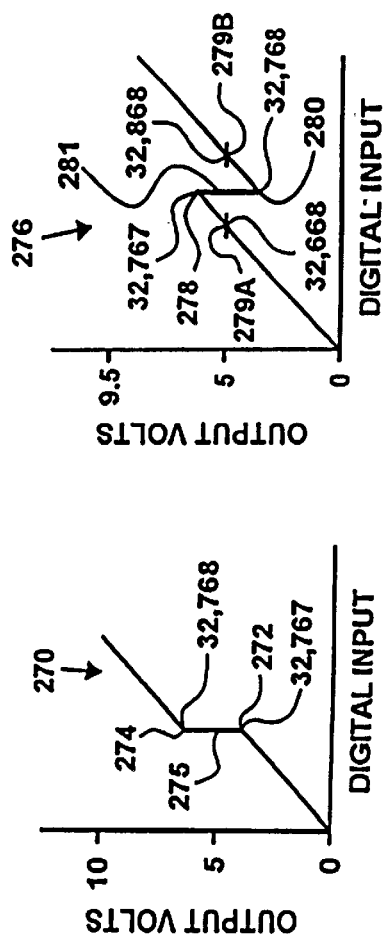
FIG. 12A PRIOR ART
FIG. 12B PRIOR ART
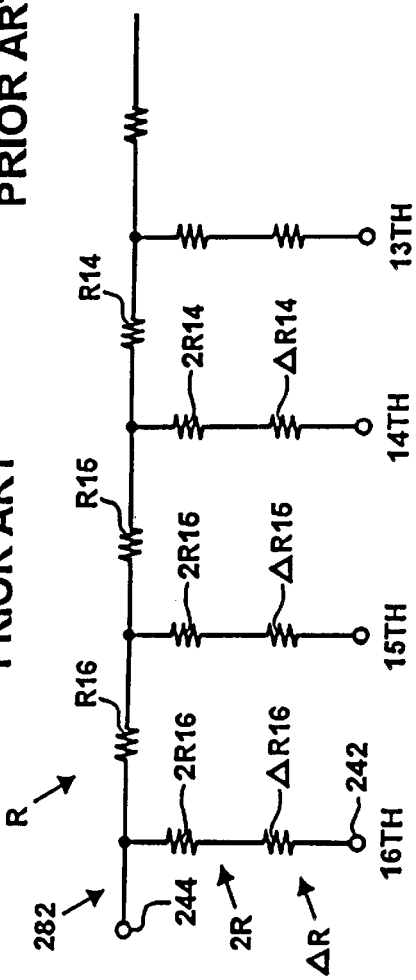
FIG. 13

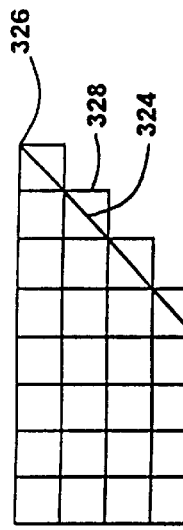
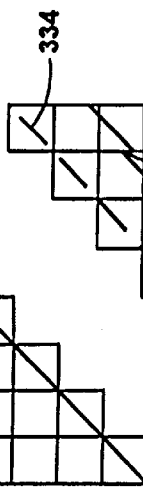
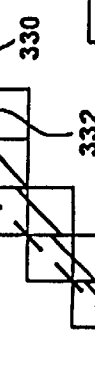
FIG. 18
FIG. 19
FIG. 20
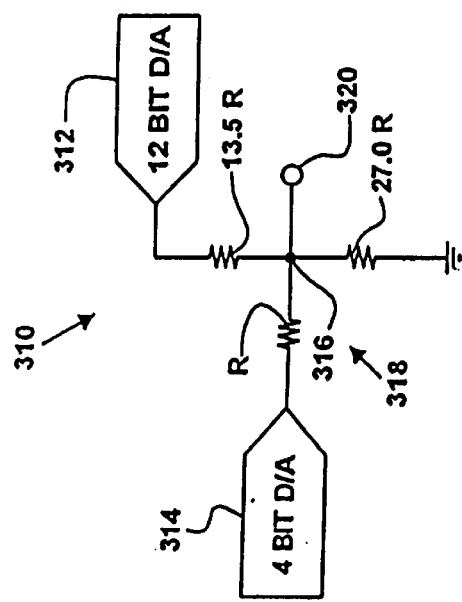
FIG. 17
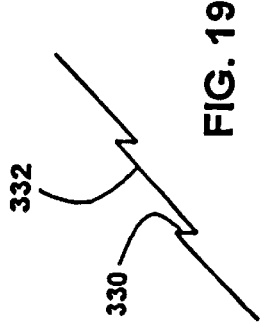
FIG. 19A

PHASE-LOCKED OSCILLATOR WITH IMPROVED DIGITAL INTEGRATOR

CROSS REFERENCES TO RELATED APPLICATIONS

This application is a Divisional of Continuation-in-part U.S. patent application Ser. No. 09/540,352, filed Mar. 31, 2000, now U.S. Pat. No. 6,411,237 which is a Continuation-in-part of U.S. patent application Ser. No. 09/353,406, filed Jul. 15, 1999, now U.S. Pat. No. 6,417,738 which is a Continuation-in-part of U.S. patent application Ser. No. 09/174,397, filed Oct. 14, 1998, now abandoned which claims the benefit of U.S. Provisional Application No. 60/069,077, filed Dec. 9, 1997, and U.S. Provisional Application No. 60/062,982, filed Oct. 21, 1997.

STATEMENT RE FEDERALLY SPONSORED RESEARCH OR DEVELOPMENT

Not Applicable

REFERENCE TO SEQUENCE LISTING

Not Applicable

BACKGROUND OF THE INVENTION

Field of the Invention

The present invention relates generally to digital integrators and phase-locked oscillators. More particularly, the present invention pertains to digital integrators with digital lead compensators, and to phase-locked oscillators with digital integrators that include digital lead compensators.

DESCRIPTION OF THE RELATED ART

Phase-locked oscillators are used in transmitters for producing an output frequency that is crystal referenced, for demodulating frequency-modulated signals in radio receivers, to achieve frequency-deviation compression in frequency-modulated and phase-modulated receivers, and in various devices in which both rapid change to selected frequencies and precise frequency control are critical.

The use of phase-locked oscillators, including use thereof to achieve frequency-deviation compression in radio receivers, is taught by Lautzenhiser in U.S. Pat. No. 5,091,706, issued Feb. 25, 1992; in U.S. Pat. No. 5,497,509, issued Mar. 5, 1996; and in U.S. Pat. No. 5,802,462, issued Sep. 1, 1998.

Phase-locked oscillators can be ac modulated, dc modulated, or both, as taught by Lautzenhiser in U.S. Pat. No. 5,091,706; in U.S. Pat. No. 5,097,230, issued Mar. 17, 1992; and in U.S. Pat. No. 5,311,152, issued May 10, 1994. In addition, phase-locked oscillators can be ac and/or dc modulated using principles taught in the aforesaid Lautzenhiser patents.

In phase-locked oscillators, both a forward path and a feedback path are connected to a crystal-controlled reference oscillator by a comparing device. Phase lock is achieved when a feedback frequency from a voltage-controlled oscillator equals the frequency of the reference oscillator.

Channelization of phase-locked oscillators is achieved by dividing frequencies in the feedback path by N, as shown herein, by any of the ways taught by Lautzenhiser in the aforesaid patents, by partial N manipulation, or by nearly any other method that is conceivable.

Since channelization of the feedback path is dependent only upon the time required to divide the frequency in the feedback path by a different number, if a channelization voltage is simultaneously applied to the VCO, channelization is extremely rapid.

AC modulation of the forward path, at frequencies above the loop frequency, may be achieved by applying an analog voltage, or modulating voltage, to the VCO via a modulation resistor, as taught in the aforesaid Lautzenhiser patents, or by any other suitable means.

DC modulation of the feedback path may be achieved by digital manipulation of pulses in the feedback path, as taught by Lautzenhiser in the aforesaid patents, or by any other suitable means.

In phase-locked oscillators, an error signal is produced by a difference in a feedback frequency to a reference frequency. This error signal may be integrated by analog or digital circuitry into phase-locking information for a given channelized frequency.

In phase-locked oscillators that use an analog integrator, the error signal is time integrated. This time-integrated error signal, which is a voltage, is applied to a capacitor and to a voltage-controlled oscillator (VCO) during the integration process. The error signal disappears and integration stops when phase lock is achieved, but the capacitor has been charged to a phase-locking voltage, or a channelizing voltage.

In phase-locked oscillators that use a digital integrator, the error signal is integrated by summing clock-timed UP, DOWN, and/or ZERO error signals. Digital-to-analog (D/A) conversion changes the digitally-integrated error signal into a voltage which is applied to the VCO during the integration process. The error signal disappears and integration stops when phase lock is achieved, but the digitally-accumulated error signals have become digital phase-locking information.

BRIEF SUMMARY OF THE INVENTION

The present invention provides digital integrators with digital lead compensators, and phase-locked oscillators that include digital integrators with digital lead compensators. The digital integrators include special circuitry that mimics analog circuitry for lead compensating the output of the integrator, thereby providing loop stability in phase-locked oscillators, even as analog integrators use a lead resistor in series with an integrating capacitor to achieve lead compensation and loop stability.

With regard to digitally integrating, in all embodiments the method of the present invention includes: repeatedly phase detecting, producing UP and DOWN signals in response to the repeated phase detecting steps; and integrating, or algebraically-summing, digital channelizing information, or digital phase-locking information, as a function of the UP and DOWN signals. More particularly, digitally integrating includes decoding plus one, minus one, and zero correction signals from the UP and DOWN signals; and algebraically summing the minus one, plus one, and zero correction signals into the digital channelizing information, or digital phase-locking information.

With regard to lead compensating, in all embodiments, the method of the present invention includes: decoding digital lead-compensation information from the UP and DOWN signals, and using the digital lead-compensation information to offset the output frequency in a leading direction when the digital phase-locking information is driving the output frequency toward phase lock.

In first and second embodiments, lead compensating includes analog summing of a channelizing voltage and a lead-compensation voltage subsequent to digital-to-analog (D/A) converting both the digital phase-locking information and the digital lead-compensation information. In a third embodiment, lead compensating includes digitally summing the digital phase-locking information and the digital lead-compensation information prior to digital-to-analog converting.

In frequency-hopping oscillators taught herein, the method of the present invention includes producing UP and DOWN signals by phase detecting, decoding the UP and DOWN signals into increment/decrement signals, recalling previously stored phase-locking information, parallel adding a single increment/decrement pulse to the recalled phase-locking information in accordance with a sign (plus one, minus one, and/or zero) of the increment/decrement signal, and storing the corrected phase-locking information in a RAM. That is, recalling, parallel adding, and again storing provide a step of algebraically summing.

The method of the present invention further includes recalling the corrected phase-locking information, repeatedly phase detecting, repeating the parallel adding, storing, and recalling steps at a clock frequency, thereby digitally integrating phase-locking information that is progressively corrected, stored, and recalled, one increment/decrement pulse at a time, at the clock frequency.

The method of the present invention still further includes using the repeatedly recalled phase-locking information, that is being corrected one increment/decrement pulse at a time at the clock frequency, to drive the output frequency of a voltage-controlled oscillator progressively closer to phase lock substantially simultaneous with the parallel adding, storing, and recalling steps.

In addition to lead-compensated digital integrators, the present invention includes improved digital-to-analog (D/A) converters that can be characterized as: producing analog outputs that are intentionally nonlinear; producing an output voltage of each of a plurality of higher bits that is less than twice the analog output of each of a plurality of respective lower bits; producing an output voltage from each of a plurality of higher bits that is less than the sum of a maximum output of all respective lower bits; producing analog outputs with a plurality of downward steps; producing a plurality of dual addresses; and being without holes, all irrespective of component variables.

By definition, a D/A converter has a hole if an increase by one in a digital input produces an increase in a voltage output that is at least twice as high as a normal increase in the output voltage. If a D/A converter has a hole in its output voltage, one digital input may produce an analog output that is too low to satisfy a need, such as phase locking, and the next higher digital input may produce an analog output that is too high to satisfy a need, such as phase locking.

In prior-art linear D/A converters, random selection of resistors and their resistive tolerances cause holes, dual addresses, and resultant nonlinearities to occur erratically with respect to one or more bits. In contrast, in the present invention, holes are absolutely abolished in any of the bits that are designed to function according to the present invention, dual addresses with respect to a plurality of higher bits are included in at least a plurality of higher bits, and the dual addresses are designed sufficiently large that variations in resistances of the various components can never eliminate any of the dual addresses nor interject a hole in the place of any dual address.

The nonlinear D/A converters of the present invention allow lower cost resistors to be used, and allow a larger number of bits to be processed, even when low cost resistors are used.

Therefore, the present invention includes a nonlinear D/A converter that excels over prior-art D/A converters in both performance and cost when used in phase-locked oscillators, and in learning systems such as frequency-hopping oscillators.

In summary, phase-locking information is generated by integration, or algebraic summation, of increment/decrement pulses that are produced by phase detecting. More particularly, integration includes not only phase detecting, but also, repeatedly recalling, correcting, and storing at a clock frequency. The progressively-integrated phase-locking information is used to drive the output frequency of the phase-locked oscillator progressively closer to phase lock, and the recalling, correcting, driving, and storing steps are repeated at the clock frequency until phase lock occurs.

As taught herein, the phase-locked oscillators of the present invention may use the nonlinear D/A converters of the present invention; and the integrator will develop digital phase-locking information, or digital channelizing information, that compensates for (corrects for) nonlinearities in the D/A converter and in any other analog component in a learning path. If the phase-locking information is retained for reuse, the phase-locked oscillator is a learning system. However, if the phase-locking information is not retained for reuse, the phase-locked oscillator is an adaptive system.

Finally, as taught herein, the digital integrators and phase-locked oscillators of the present invention may be used in frequency-hopping oscillators. When one of the nonlinear D/A converters is used in one of the frequency-hopping oscillators, the frequency-hopping oscillator becomes a learning system in that it learns, retains, and reuses channelizing information that compensates for nonlinearities in the nonlinear D/A converter and all other analog components in a learning path.

In a first aspect of the present invention, a method for rapidly and accurately producing channelized frequencies comprises: repeatedly phase detecting; producing UP and DOWN signals in response to the repeated phase detecting steps; integrating digital channelizing information for one of the channelized frequencies as a function of the UP and DOWN signals; driving an output frequency toward phase lock in response to the digital channelizing information; and offsetting the output frequency in a leading direction during the driving step.

In a second aspect of the present invention, a method for phase locking an output frequency to a reference frequency comprises: repeatedly phase detecting; producing UP and DOWN signals as a function of the repeated phase detecting steps; integrating digital phase-locking information as a function of the UP and DOWN signals; decoding digital lead-compensation information as a function of the UP and DOWN signals; and driving the output frequency to phase lock in response to both the phase-locking information and the lead-compensation information.

In a third aspect of the present invention, a method for phase locking an output frequency to a reference frequency comprises: repeatedly phase detecting; producing UP and DOWN signals as a function of the repeated phase detecting steps; decoding plus one, minus one, and zero correction signals from the UP and DOWN signals; algebraically-summing the plus one, minus one, and zero correction signals into digital phase-locking information; decoding digital lead-compensation information from the UP and DOWN signals; and driving the output frequency in response to both the phase-locking information and the digital lead-compensation information.

In a fourth aspect of the present invention, a method for rapidly phase locking an output frequency to a selected frequency comprises: recalling previously-stored digital information for phase locking the output frequency to the selected frequency; driving the output frequency toward phase lock with the selected frequency in response to the recalled digital information; offsetting the output frequency in a leading direction during the driving step; adaptively correcting the recalled digital information, as a function of a phase difference between the output frequency and the selected frequency, subsequent to the driving step; and digitally storing the adaptively-corrected digital information.

In a fifth aspect of the present invention, a method comprises: developing digital information for driving an output frequency to approximate phase lock with a selected frequency; storing the developed digital information; recalling the stored digital information; digital-to-analog converting bits of the recalled digital information; driving the output frequency toward the phase lock in response to the converted bits of the digital information; and the digital-to-analog converting step comprises preventing holes in an output voltage produced by the digital-to-analog converting step.

In a sixth aspect of the present invention, a method for phase locking an output frequency to a reference freequency comprises: comparing a feedback frequency with the reference frequency; producing a signal, in respons to the comparing step, that indicates whether the output frequency is too high, too low, or at phase lock; digitally integrating the signal; driving the output frequency toward the phase lock in response to the digitally-integrated signal; lead compensating the output frequency during the driving step; and the driving and lead compensating steps comprise digital-to-analog converting.

In a seventh aspect of the present invention, a method for phase locking an output frequency to a reference frequency comprises: comparing a feedback frequency with the reference frequency; producing a digital plus one, a digital minus one, or a digital zero, in response to the comparing step, depending upon whether the output frequency is too high, too low, or at phase lock; accumulatively summing the digital plus one, the digital minus one, or the digital zero, at a clock frequency; and the accumulative summing step comprises recalling, parallel adding, and storing the digital plus one, the digital minus one, or the digital zero at the clock frequency.

In an eighth aspect of the present invention, a phase-locked oscillator comprises: a phase-locked loop that includes both a forward path and a feedback path; a phase comparator that interconnects the forward path and the feedback path; a voltage-controlled oscillator that is interposed into the forward path; a parallel adder that is interposed into the forward path intermediate of the phase comparator and the voltage-controlled oscillator; and a digital integrator that is connected to the phase comparator and to the voltage-controlled oscillator, and that comprises a RAM and the parallel adder.

In a ninth aspect of the present invention, a phase-locked oscillator comprises: a phase-locked loop that includes both a forward path and a feedback path; a phase comparator that interconnects the forward path and the feedback path; a voltage-controlled oscillator that is interposed into the forward path; an integrator that is connected to the phase comparator and the voltage-controlled oscillator; and the integrator comprises means for accumulatively summing a plus one, a minus one, and/or a zero at a clock frequency.

In a tenth aspect of the present invention, a phase-locked oscillator comprises: a phase-locked loop that includes both a forward path and a feedback path, and that operates at a loop frequency; a phase comparator that interconnects the forward path and the feedback path; a voltage-controlled oscillator that is interposed into the forward path; an integrator that is connected to the phase comparator and the voltage-controlled oscillator; and the integrator comprises means for accumulatively summing a plus one, a minus one, and/or a zero at a frequency that exceeds the loop frequency.

BRIEF DESCRIPTION OF THE SEVERAL VIEWS OF THE DRAWINGS

FIG. 12A is a diagram, showing in smoothed curve form, that variations in output voltages of the D/A converter of FIG. 9 may cause holes;

FIG. 12B is a diagram, showing in smoothed curve form, that variations in resistances of standard resistors may result in duplicate input addresses;

FIG. 13 is a schematic drawing of a preferred embodiment of a nonlinear D/A converter for use with channelized phase-locked oscillators and frequency-hopping oscillators of the present invention;

FIG. 14 is a diagram showing that voltage output vs. input for the conventional D/A converter of FIG. 9 is linear;

FIG. 15 is a diagram showing that voltage output vs. input for the D/A converter of FIG. 13 is nonlinear;

FIG. 17 is a schematic diagram of an embodiment of the nonlinear D/A converter of the present invention in which voltage summing of 12-bit and 4-bit D/A converters provides nonlinearity;

FIG. 18 is a graph of output voltages vs. digital inputs, showing both the voltage output of a conventional linear D/A converter;

FIG. 19 is a graph of output voltage vs. input of the nonlinear D/A converter of FIGS. 17, 21, and 22;

FIG. 19A is a graph of output voltage vs. input, reproducing a portion of the graph of FIG. 19 in an enlarged scale for the purpose of more clearly showing the downward steps that provide dual addresses;

FIG. 20 is a graph of output voltage vs. input of the nonlinear D/A converter of FIGS. 17, 21, and 22, showing that, rather than allowing the output voltage to fall below a linear output voltage, the nonlinear output voltage may be raised to approximate the output of a conventional D/A converter;

DETAILED DESCRIPTION OF THE INVENTION

Figure 1:
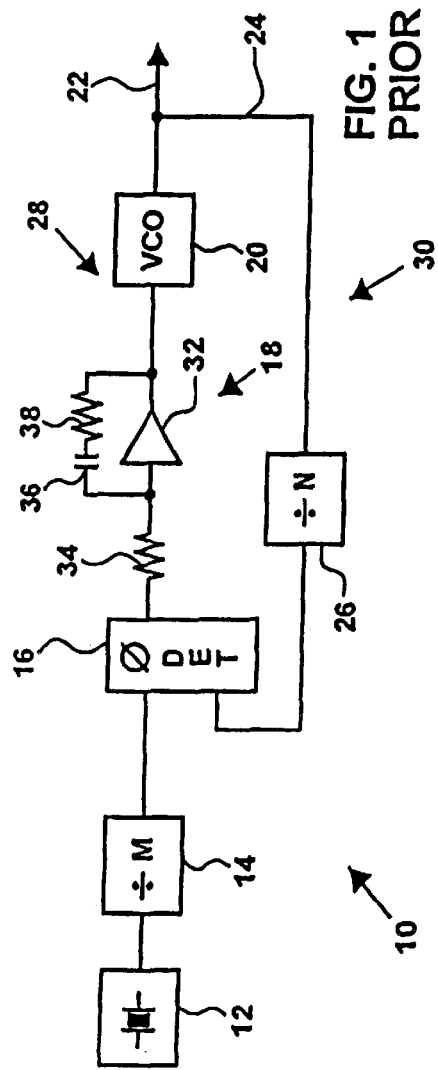
FIG. 1 is a schematic drawing of a prior-art phase-locked loop with an analog integrator.
Figure 2:
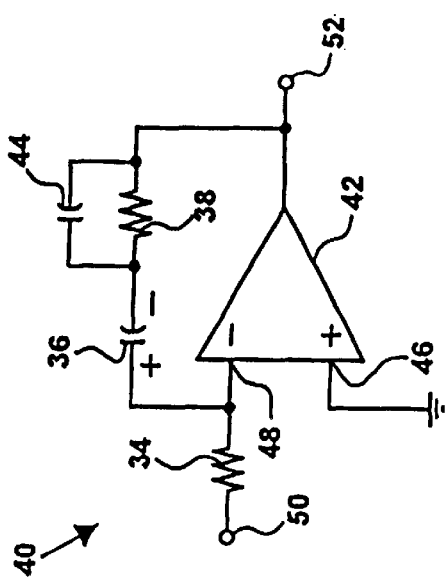
FIG. 2 is a schematic drawing of a prior-art analog integrator for the phase-locked loop, similar to that of FIG. 1, but in more detail.

Referring now to FIGS. 1 and 2, before considering the preferred embodiment of the present invention, a brief review of phase-locked oscillators and integrators may be helpful. Also, it is appropriate to review integrators with lead compensation, since lead compensation is necessary to achieve stability in phase-locked loops.

A prior-art phase-locked oscillator 10 of FIG. 1 includes a reference oscillator 12, a divider 14 for dividing the reference frequency of the reference oscillator 12 by a constant value of M, a phase comparator, or phase detector, 16, an analog integrator 18, a voltage-controlled oscillator (VCO), or radio-frequency oscillator, 20, an output frequency conductor 22, and a feedback conductor 24. A divider 26 may be included to reduce operating frequencies of the phase detector 16 by dividing by N, or to achieve channelization of frequencies produced by the VCO 20 by dividing by selected values of N.

The phase-locked oscillator 10 also includes both a forward path 28 and a feedback path 30. The forward path 28 extends from the phase detector 16 to the output frequency conductor 22, and the feedback path 30 extends from the output frequency conductor 22 to the phase detector 16. Thus, by definition, the phase detector 16 is in neither the path 28 nor the path 30.

The integrator 18, as shown in FIG. 1, includes an operational amplifier 32, a coupling resistor 34, an integrating capacitor 36, and a lead-compensation resistor 38. However, in actual practice, an analog integrator 40 of FIG. 2 is used that includes a reference-frequency spurious-suppressing capacitor.

That is, the integrator 40 includes an operational amplifier 42, the coupling resistor 34, the integrating capacitor 36, the lead-compensation resistor 38, and a reference-frequency spurious-suppressing capacitor 44.

The operational amplifier 42 of FIG. 2 includes a positive input terminal 46 that is connected to ground, as shown, and a negative input terminal, or inverting input terminal, 48. As shown, the coupling resistor 34 is connected to the negative input terminal 48.

Since the positive input terminal 46 is grounded, the operational amplifier 42 will hold the negative input terminal 48 at virtual ground. Therefore, if a constant positive voltage is applied to an input node 50, a constant current will flow through the coupling resistor 34 that is a function of the constant voltage and the resistance of the resistor 34.

Because of the high input impedance of the operational amplifier 42, there will be negligible current into the negative input terminal, or inverting input terminal, 48. This means that virtually all of the current from the voltage applied to the input node 50 will flow into the capacitor 36 and through the resistor 38. Therefore, the current flow into the capacitor 36 and through the resistor 38 will be equal to the current flow through the resistor 34 until integration is complete.

With a positive voltage at the input node 50, current flow is in a direction from the input node 50, to the negative input terminal 48, through the capacitor 36, and through the resistor 38 to an output node 52. Thus, positive and negative sides of the capacitor 36 are as shown for a positive input voltage at the node 50, and the integrator 40 ramps a voltage negatively between the capacitor 36 and the resistor 38.

Because of the aforementioned current flow through the resistor 38, and the voltage drop across the resistor 38, a voltage is produced at the node 52 that is more negative than the negatively-ramped voltage that is produced by the capacitor 36. This additional negative voltage provides lead compensation. Lead compensation is required for stability of phase-locked oscillators, such as the phase-locked oscillator 10 of FIG. 1.

The fact that lead compensation is required for stability of phase-locked loops is attested to by P. V. Brennan in *Phase-Locked Loops, Principles and Practice*, McGraw-Hill, 1996 in section 3.2, pages 33–37. As taught in CMOS/NMOS, Special Functions Data, Series A, 1984, pages 6–43, the equation for damping is: $\zeta=(\bar{\omega} \times R \times C)/2$, where R is the resistance of the lead-compensation resistor 38, and C is the capacity of the integrating capacitor 36. As seen by this formula, when R goes to zero, damping goes to zero which means that the phase-locked oscillator 10 becomes unstable.

Figure 3:
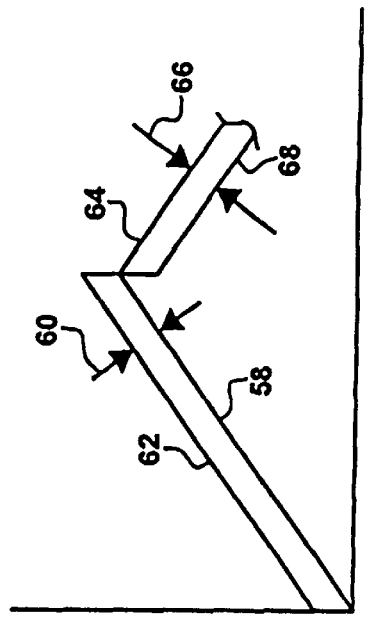
FIG. 3 is a graph of an integrated signal, showing lead compensation added thereto.
Figure 4:
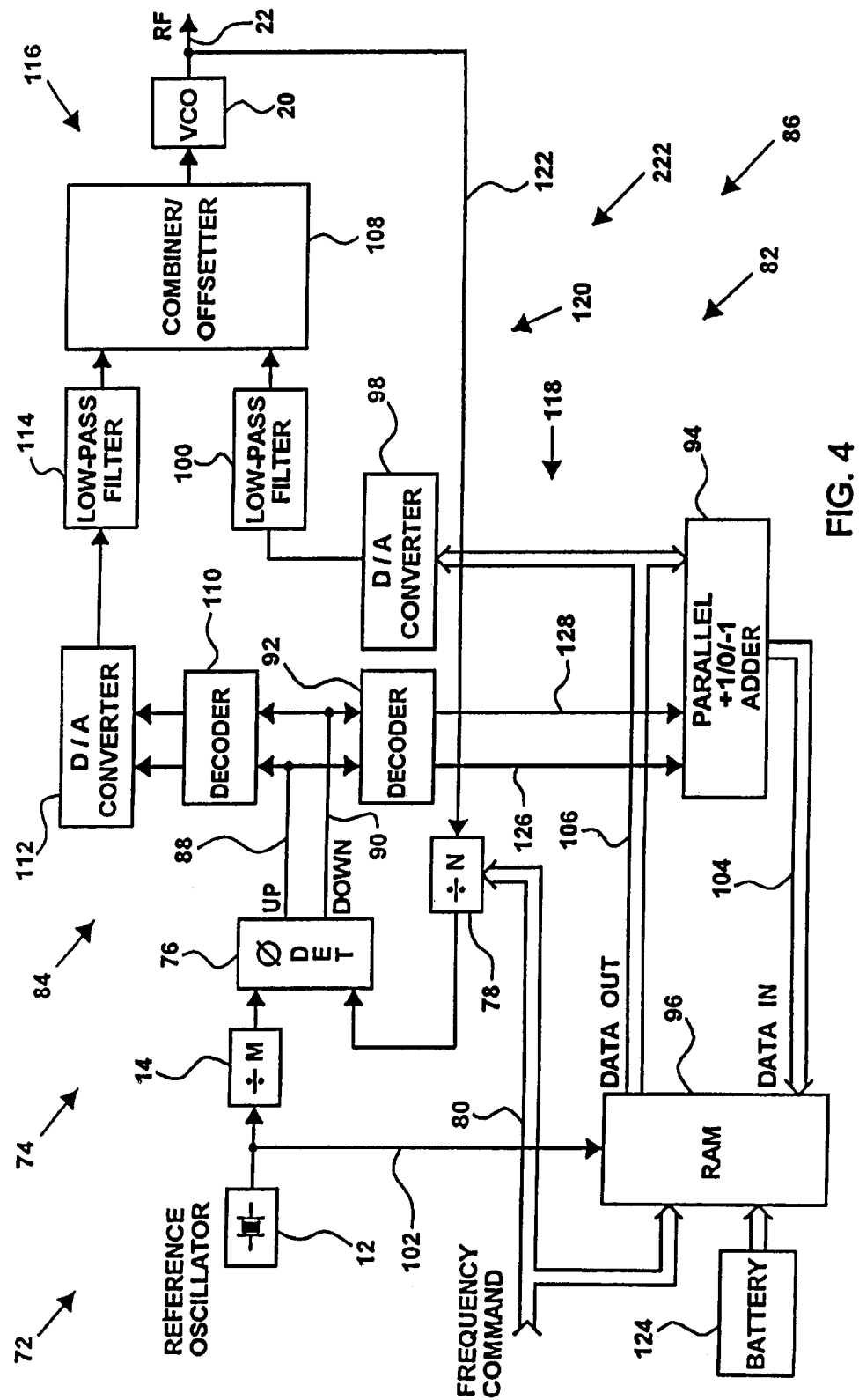
FIG. 4 is a schematic drawing of a preferred embodiment of the present invention in which a frequency-hopping oscillator utilizes digital integration, and digital lead compensation is added by analog summing of a channelizing voltage and a lead-compensation voltage, subsequent to digital-to-analog converting of digital channelizing information and digital lead-compensation information.
Figure 6:
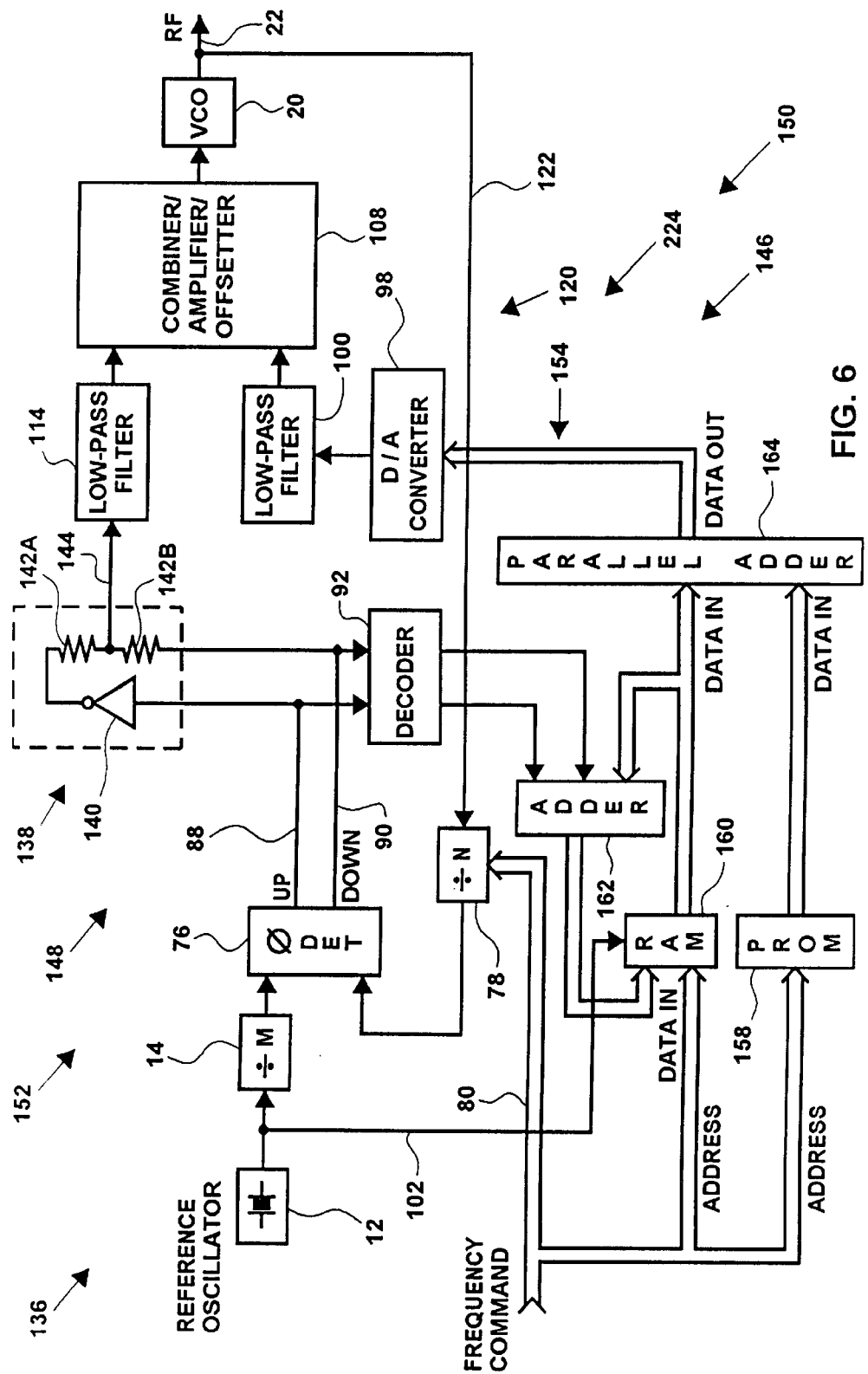
FIG. 6 is a schematic drawing of an embodiment of the present invention in which a frequency-hopping oscillator utilizes digital integration, digital lead compensation information is added by analog summing, and a PROM is used to provide initial phase-locking information for selected channels.
Figure 7:
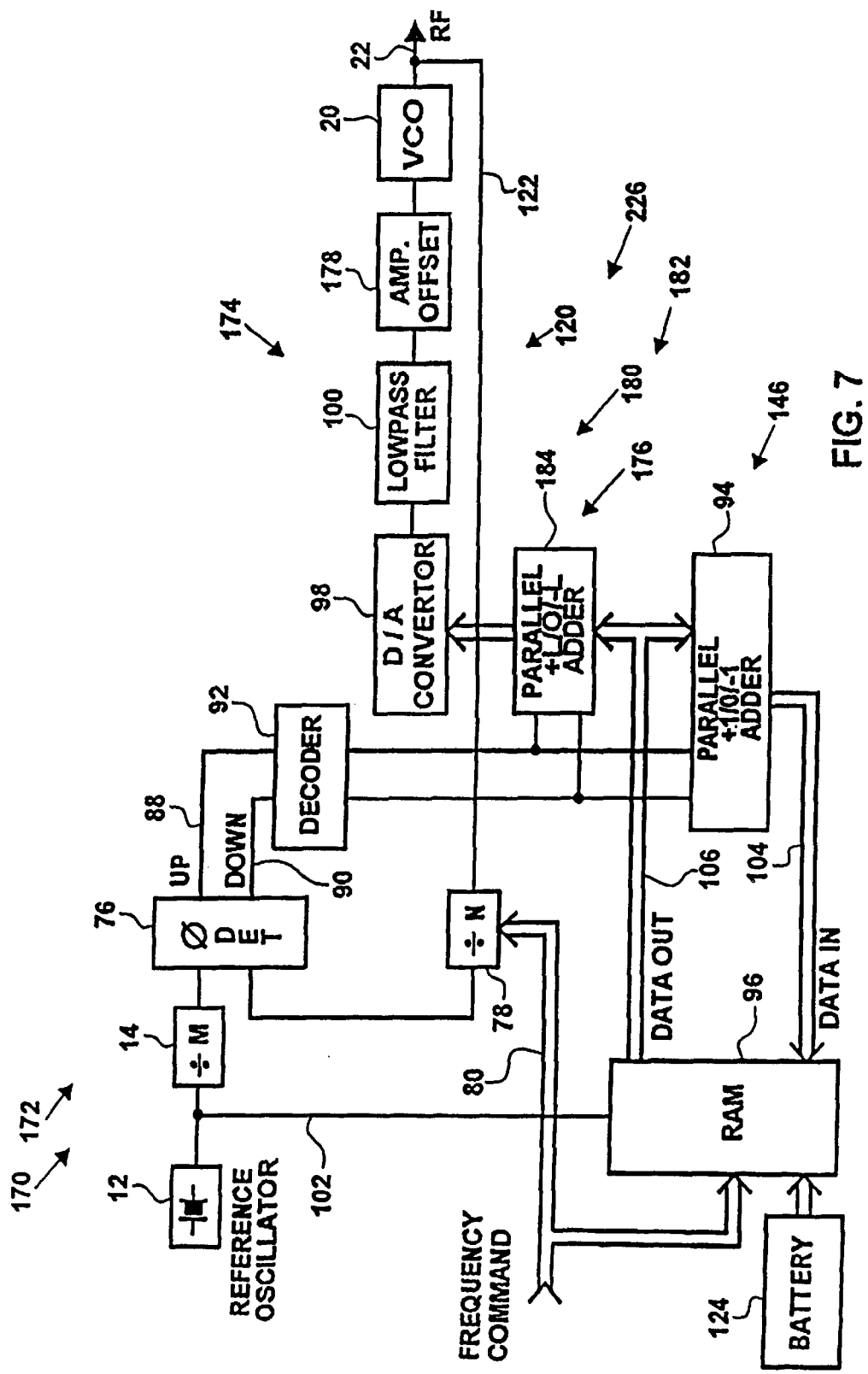
FIG. 7 is a schematic drawing of an embodiment of the present invention in which a frequency-hopping oscillator utilizes digital integration, and digital lead-compensation information is added by digitally summing the digital channelizing information and the digital lead-compensation information, rather than by analog summing as in FIGS. 4 and 6.

In the embodiments of FIGS. 4, 6, and 7, digital integrators are provided with lead compensators that mimic the lead-compensation resistor 38 of FIGS. 1 and 2. A graph of FIG. 3 will be helpful in understanding the digital lead compensators of FIGS. 4, 6, and 7.

Referring now to FIG. 3, an increasing integrator output 58 is accompanied by a lead-compensation signal 60, thereby providing a lead-compensated output 62 that is more positive than the increasing integrator output 58 by a constant and predetermined magnitude. In like manner, a decreasing integrator output 64 is accompanied by a lead-compensation signal 66, thereby providing a lead-compensated output 68 that is more negative than the decreasing integrator output 64 by a constant and predetermined magnitude.

As the integrator output 58 of FIG. 3 increases, an output frequency in the output frequency conductor 22 of FIG. 1 moves toward phase lock with the reference oscillator 12.

Referring now to FIG. 4, before reciting the structure and operation in detail, a brief preview will be presented. This overview should not only be clearly understandable, but should also make the detailed description easier to understand.

A frequency-hopping oscillator, or learning system, 72 includes a phase-locked oscillator 74. The phase-locked oscillator 74 includes the reference oscillator 12, the divider 14, a phase comparator, or phase detector, 76, the VCO 20, the output frequency conductor 22, and a divider 78 in which N is controllable digitally by a command signal in a command bus, or bundle of frequency-command conductors, 80.

Assuming that one channelized frequency has been selected for the first time by the frequency-command conductors 80, phase-locking information for this one channelized frequency is digitally integrated from frequency-correction information produced by the phase detector 76, thereby generating phase-locking information.

As will be described in detail subsequently: the method of the present invention includes producing UP and DOWN signals by phase detecting; converting the UP and DOWN signals into increment/decrement signals by decoding; recalling previously-stored digital phase-locking information, or digital channelizing information; parallel adding one increment/decrement pulse to the recalled phase-locking information as an algebraic function of one of the increment/decrement signals; driving the output frequency toward phase lock with a reference frequency in response to the digital phase-locking information; and storing the parallel-added sum.

The method of the present invention further includes: developing a lead compensation signal, or digital lead-compensation information, in response to the UP and DOWN signals; and driving the output frequency toward phase lock in response to the phase-locking information and the lead-compensation information.

Although the phase-locking information for this one channelized frequency is developed and stored in digital form during the learning process, it proceeds to the VCO 20 through D/A and analog components that produce errors. Therefore, when phase lock occurs, the phase-locking information has been compensated for analog errors in proportionality and linearity.

Thereafter, when this one channelized frequency is selected and the respective phase-locking information is recalled from a digital memory and D/A converted into a channelizing voltage, the VCO 20 will be driven to an output frequency that almost equals the output frequency at phase lock.

Further, each time that this same channelized frequency is selected, the phase-locking information is updated for any error in output frequency such as temperature drift of analog or D/A components. Error signals are processed by the phase detector 76 at the frequency of the reference oscillator 12, so that this updating occurs even if the output frequency remains at one channelized frequency for a very short period of time.

Inclusion of the divider 14 allows increasing a frequency of the reference oscillator 12 in excess of an allowable frequency of operation of the phase detector 76, thereby providing an exceptionally fast sampling rate.

Continuing to refer to FIG. 4, the frequency-hopping oscillator 72 utilizes a digital integrator 82 and a digital lead compensator, or lead signal means, 84. The digital integrator 82 and the digital lead compensator 84 provide a lead-compensated digital integrator 86 that offsets the output frequency in a leading direction during the driving step.

However, before discussing the digital integrator 82 and the digital lead compensator 84, it is important to consider the phase detector 76 in more detail. The phase detector 76, which preferably is Motorola part number 45152, has three output states. That is, an output in an UP conductor 88, and an output in a DOWN conductor 90 may separately be either a binary 1 or a binary 0, but since the phase detector 76 does not output 0,0, it outputs only three states.

When the UP conductor 88 produces a 0, and the DOWN conductor 90 produces a 1, these outputs reflect the fact that the frequency produced by the VCO 20 is too low. Conversely, when the UP conductor 88 produces a 1, and the DOWN conductor 90 produces a 0, these outputs reflect the fact that the frequency of the VCO 20 is too high. And when both of the conductors, 88 and 90, produce a 1, the frequency-hopping oscillator 72 is phase locked.

The digital integrator 82 includes a pulse decoder 92, a parallel adder 94, and a RAM 96. A D/A converter 98 and a low-pass filter 100 convert the digital signal to an analog voltage that is suitable for driving the VCO 20.

In operation, the decoder 92 receives one of the three output states (0,1; 1,0; or 1,1) from the phase detector 76, as noted above, and delivers separate and distinct single-bit outputs to the parallel adder 94. Either one of the two digital outputs will remain constant until the output condition of the phase detector 76 changes to another one of the three output states. A more detailed description of the decoder 92 and the parallel adder 94 will be provided in conjunction with FIG. 5.

The parallel adder 94, which is a 16-bit device, utilizes the binary outputs of the decoder 92 as sixteen 0's, fifteen 0's followed by a 1, or sixteen 1's.

Digital integration is achieved as follows: the RAM 96, which is connected to the reference oscillator 12 by a sampling-rate conductor 102, accepts a first sample, or a first increment/decrement pulse, of the digital output provided by the decoder 92 via the parallel adder 94 and a 16-bit data-in bus 104. This increment/decrement pulse is stored in the RAM 96.

At the frequency of the reference oscillator 12, this first increment/decrement pulse is delivered back to the parallel adder 94 via a 16-bit data-out bus 106 to be algebraically summed with a second sample, or a second increment/decrement pulse, the algebraic sum of the first and second increment/decrement pulses are delivered to the RAM 96 via the data-in bus 104, and this algebraic sum is delivered back to the parallel adder 94 via the data-out bus 106. This cycle repeats at the frequency of the reference oscillator 12 until the frequency-hopping oscillator 72 is in phase lock, or until the frequency command in the command bus 80 is changed.

Simultaneously with the process of digital integration as described above, the progressively and algebraically summed values are delivered to the D/A converter 98 which is capable of processing sixteen bits of information, an analog voltage is outputted by the D/A converter 98 and delivered to the low-pass filter 100, and the filtered analog voltage is applied to the VCO 20 through a combiner/ offsetter 108 until the frequency-hopping oscillator 72 phase locks.

This process of digital integration is repeated the first time a frequency command in the command bus 80 selects a channelized frequency by changing the value of N, thereby changing the output frequency at which the frequency-hopping oscillator 72 will phase lock. And, each time the frequency-hopping oscillator 72 phase locks to a selected frequency, the digitally integrated outputs are stored in the RAM 96.

The next time the frequency-hopping oscillator 72 hops to a channelized frequency, the frequency command changes the value of N, and the RAM 96 cooperates with the D/A converter 98, the low-pass filter 100, and the combiner/ offsetter 108, to supply a channelizing voltage to the VCO 20, and thereby drive the VCO 20 to an output frequency that approximates phase lock for the selected one of channelizing frequencies. This channelizing occurs in less than one microsecond so that the present invention rapidly and accurately produces channelizing frequencies.

It can be seen that the digital values stored in the RAM 96 are the values that, for a given time and temperature, correct for production variations in proportionality, nonlinearities, and temperature drifts of the D/A converter 98, the combiner/offsetter 108, and the VCO 20.

That is, as the RAM 96 digitally integrates a channelizing voltage that will phase lock the system, the RAM-stored digital values are inherently compensated for analog inaccuracies of the D/A converter 98, the combiner/offsetter 108, and the VCO 20. Phase lock is accomplished by applying RAM-accumulated values that keep correcting until phase lock is achieved.

It is important to notice that the phase-locking information will be updated each time a given channelized frequency is produced, and the stored phase-locking information will be updated at the frequency in the sampling-rate conductor 102, unless that channelized frequency is already in phase lock, if the frequency-hopping oscillator 72 remains at that channelized frequency for a period of time that allows the phase detector 76 to provide even one signal in one of the conductors, 88 or 90.

For example, if the reference oscillator 12 is producing a reference frequency of 8.0 MHz, and the divider 14 is dividing by 128, the phase detector 76 will be operating with a reference frequency of 62,500 Hz.

In this example, in 125 nanoseconds after receiving either an UP or a DOWN signal from the phase detector 76, the RAM 96 will obtain a sample for algebraic addition to the value previously stored in the RAM 96 for that given channelized frequency.

Continuing to refer to FIG. 3, as previously mentioned, the lead-compensated digital integrator 86 includes the digital lead compensator 84. And, as also previously mentioned, the digital lead compensator 84 performs the function of the resistor 38 of FIGS. 1 and 2.

Since the output of a decoder 110 is always of the same sense as the output of the decoder 92, the decoder 110 decodes lead-compensation information. All that remains is to apply this lead-compensation information to the VCO 20 as a voltage.

That is, the increasing integrator output 58 as shown in FIG. 3, of the digital integrator 82 of FIG. 4, is accompanied by the lead-compensation signal 60, so that the lead-compensated output 62 of FIG. 3 is the sum of both the output of the digital integrator 82 and the digital lead compensator 84.

In the preferred embodiment of FIG. 4, application of the lead-compensation signal to the VCO 20 is via a 2-bit D/A converter 112, a low-pass filter 114, and the combiner/ offsetter 108.

The combiner/offsetter 108 algebraically adds the lead-compensation signal, as converted to an analog voltage by the D/A converter 112 and filtered by the low-pass filter 114, to the output of the digital integrator 82, as stored in the RAM 96, and as converted to an analog voltage by the D/A converter 98 and filtered by the low-pass filter 100.

As described above, it can be seen that the digital lead compensator 84 includes the decoder 110, the D/A converter 112, and the combiner/offsetter 108, although only the combiner portion is actually a part of the digital lead compensator 84.

The combiner/offsetter 108 serves two functions, as named. It functions as an algebraic summer of analog voltages, and it offsets the summed and amplified signal to a voltage that is in the linear tuning range of the VCO 20.

The frequency-hopping oscillator 72 includes a phase-locked loop 116. The phase-locked loop 116 includes both a forward path 118 and a feedback path 120. The forward path 118 extends from the phase detector 76 to the output frequency conductor 22 via the digital integrator 82, the combiner/offsetter 108, and the VCO 20. The feedback path 120 extends from the output frequency conductor 22 to the phase detector 76 via a feedback conductor 122 and the divider 78 and includes both the divider 78 and the feedback conductor 122.

If a backup battery 124 is included at the factory, the frequency-hopping oscillator 72 will learn to compensate for variations in component proportionalities and nonlinearities during burn-in. If the battery 124 is not included, the frequency-hopping oscillator 72 will learn to compensate for variations in component proportionalities and nonlinearities each time the frequency-hopping oscillator 72 is initiated.

In operation, a frequency is selected by a source separate from, and not a part of, the present invention. The command for this frequency is delivered to the RAM 96 via the command bus 80 through which a digitized address representing this selected frequency is transmitted.

As will be described in conjunction with the embodiment of FIG. 6, the decoder 110 and the D/A converter 112 can be replaced by a device that includes only three components: an inverter and two resistors.

Figure 5:
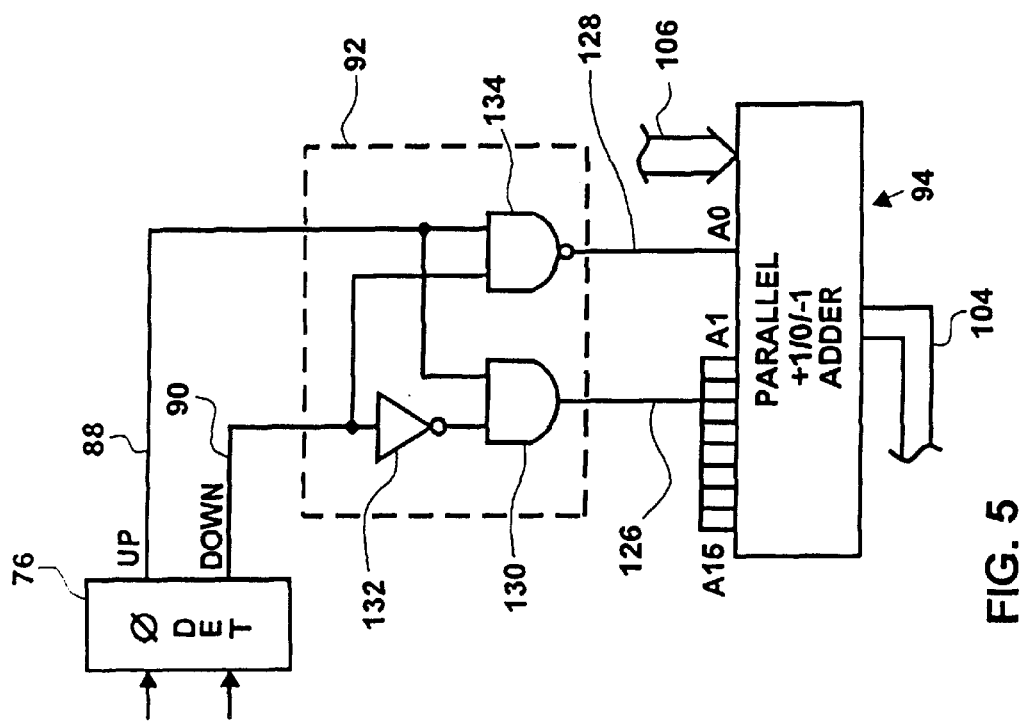
FIG. 5 is a schematic drawing showing details of a decoder that is used in conjunction with the parallel adder in the embodiment of FIG. 4.

For a more complete understanding of the embodiment of FIG. 4, and also of FIGS. 6 and 7, the decoder 92 is shown in FIG. 5 and is described in detail therewith. To more clearly show and describe connections of the decoder 92 of FIG. 5 with FIGS. 4, 6, and 7, conductors 126 and 128 are shown in FIGS. 4–7. The parallel adder 94 is also shown in more detail in FIG. 5. More particularly, the conductor 126 of FIGS. 4 and 5 is shown connected to bits A1 through A15, and the conductor 128 is shown connected to a bit A0.

Referring now to FIG. 5, in operation, 1 is added by the parallel adder 94 when a 1 is supplied to the A0 bit via the conductor 128 and 0's are applied to the bits A1 through A15 via the conductor 126. Since binary subtraction by 1 is accomplished by adding 1 to all bits, 1 is subtracted from the parallel adder when a 1 exists in both conductors, 126 and 128.

Further, since the sampling-rate conductor 102 connects the reference oscillator 12 to the parallel adder 94, the parallel adder 94 continues to add 1 or to subtract 1 at the frequency of the reference oscillator 12.

Continuing to refer to FIG. 5, the decoder 92 includes an AND gate 130, an inverter 132, and a NAND gate 134.

In operation, when an output frequency of the VCO 20 of FIG. 4 is too low, the UP conductor 88 outputs a 0, and the DOWN conductor 90 outputs a 1. The inverter 132 of FIG. 5 inverts its 1 input to a 0, so that both inputs to the AND gate 130 are 0, and the AND gate 130 outputs a 0 to the bits A1 through A15 via the conductor 126, since AND gates output a 1 only when both inputs are 1.

At this time, the UP conductor 88 delivers a 0 to the NAND gate 134 and the DOWN conductor 90 delivers a 1 to the NAND gate 134, so that the NAND gate 134 delivers a 1 to the A0 bit via the conductor 128, since NAND gates output a 0 only when both inputs are 1.

With 0's applied to bits A1–A15, and with a 1 applied to bit A0, the parallel adder 94 continues to add ones as long as the UP conductor 88 produces a 0 and the DOWN conductor 90 produces a 1.

When an output frequency of the VCO 20 is too high, the UP conductor 88 produces a 1, the DOWN conductor 90 produces a 0, the NAND gate 134 delivers a 1 to the bit A0, the AND gate 130 delivers a 1 to the bits A0–A15, and the parallel adder 94 subtracts at a rate determined by the reference oscillator 12.

When the phase-locked oscillator 74 of FIG. 4 is in phase lock, the UP conductor 88 produces a 1, the DOWN conductor 90 produces a 1, the NAND gate 134 delivers a 0 to the bit A0, the inverter 132 and the AND gate 130 cooperate to deliver a 0 to the bits A0 through A15, and the parallel adder 94 neither adds nor subtracts.

Referring now to FIG. 6, a frequency-hopping oscillator, or learning system, 136 includes components as identified in conjunction with the frequency-hopping oscillator 72 of FIG. 4, except as included in the following description. One of the differences between the embodiments of FIGS. 4 and 6 resides in apparatus that FIG. 6 uses to achieve lead compensation. This will be described before discussing the learning system 136 as a whole.

The frequency-hopping oscillator 136 of FIG. 6 includes an analog decoder 138 that replaces both the decoder 110 and the D/A converter 112 of the frequency-hopping oscillator 72 of FIG. 4. While the decoder 110 and the D/A converter 112 illustrate the necessary functions, the decoder 138 is the actual device that would be used in the embodiments of FIGS. 4 and 6.

The decoder 138 includes an inverter 140 and resistors 142A and 142B. The resistors 142A and 142B are connected in series, as shown, and a conductor 144 is a center tap. Therefore, although not separately numbered, the resistors 142A and 142B form a center-tapped resistor. The resistors 142A and 142B have equal resistances.

When phase lock occurs, the phase comparator 76 produces UP and DOWN signals of 5.0 volts. Since the 5.0 volt UP signal is inverted by the inverter 140, 0.0 volts is applied to the resistor 142A, 5.0 volts is applied to the resistor 142B, and 2.5 volts are delivered to the conductor 144. Therefore, 2.5 volts is the lead-compensation null voltage.

When an output frequency from the VCO 20 is too low to phase lock, the phase comparator 76 delivers an UP signal of 0.0 volts and a DOWN signal of 5.0 volts. Since the 0.0 volt UP signal is inverted by the inverter 140, 5.0 volts are applied to both resistors, 142A and 142B, 5.0 volts is delivered to the conductor 144 that is connected between the resistors, 142A and 142B, and a lead-compensation voltage of 5.0 volts, which is 2.5 volts greater than null, is delivered to the VCO 20 via the combiner/offsetter 108. The lead-compensation voltage delivered to the VCO 20 may be 5.0 volts, or as proportioned in the combiner/offsetter 108.

When an output frequency from the VCO 20 is too high to phase lock, the phase comparator 76 delivers an UP signal of 5.0 volts and a DOWN signal of 0.0 volts. Since the 5.0 volt UP signal is inverted by the inverter 140, 0.0 volts are applied to both resistors, 142A and 142B, 0.0 volts is delivered to the conductor 144 that is connected between the resistors, 142A and 142B, and a lead-compensation voltage of 0.0 volts, which is 2.5 volts lower than null, is applied to the VCO 20.

Since the same UP and DOWN signals are delivered to the decoder 92, which is a part of a digital integrator 146, when the digital integrator 146 is counting upwardly and the D/A converter 98 is producing an ever-increasing voltage, the decoder 138 produces its highest lead-compensation voltage.

In like manner, when the digital integrator 146 is counting downwardly, the decoder 138 supplies 0.0 volts to the combiner/offsetter 108. Since 0.0 volts is lower by 2.5 volts than the lead-compensation null voltage of 2.5 volts, the combiner/offsetter 108 reduces the voltage applied to the VCO 20 by the D/A converter 98. Thus as described here, and as shown in FIG. 3, lead compensation is always in the same direction as integration.

The decoder 138 cooperates with the combiner/offsetter 108 to provide a digital lead compensator 148, and the digital lead compensator 148 cooperates with the digital integrator 146 to provide a lead-compensated digital integrator 150. The lead-compensated digital integrator 150 is part of a phase-locked oscillator 152, and the phase-locked oscillator 152 is a part of the frequency-hopping oscillator 136. The phase-locked oscillator 152 includes a forward path 154 and the feedback path 120. Identification of components included in the paths, 154 and 120, can be made by comparing the embodiments of FIGS. 4 and 6.

A PROM 158 is preloaded with phase-locking information such that when this phase-locking information is converted to an analog channelizing voltage via the D/A converter 98, the output frequency of the frequency-hopping oscillator 136 will be near phase lock.

The phase-locking information that is preloaded into the PROM 158 may be values that will produce output frequencies having nominal, or handbook, performance characteristics, but that will produce output frequencies that vary in accordance with actual variations in proportionality and linearity of the D/A converter 98, the combiner/offsetter 108, and the VCO 20. Even though the values of the phase-locking information that are burned into the PROM 158 are only average values, several seconds are saved in achieving phase lock at start-up.

If the PROM 158 is of the electrically erasable type, the PROM 158 may be manually programmed, starting from an average value, to produce a zero output from a RAM 160, thereby programming the PROM 158 in accordance with actual system performance. Or, if the RAM 160 includes sixteen bits or more, the frequency-hopping oscillator 136 may be run through all channelized frequencies, and then the phase-locking values of the phase-locking information that developed in the RAM 160 may be duplicated in the PROM 158, thereby extending the learning characteristics of the frequency-hopping oscillator 136 to the PROM 158.

Starting with the PROM 158 loaded by any suitable method, such as any of the three described above, if, upon start-up, the VCO 20 is operating at too low an output frequency, for a given channel, to phase lock with the reference oscillator 12, the decoder 92 commands a parallel adder 162 to place digitized frequency-correcting information into the RAM 160. Then the contents of the RAM 160 are added to the digital output of the PROM 158 by a parallel adder 164. The result is an analog channelizing voltage, as produced by the D/A converter 98, driving the VCO 20 to phase lock.

Preferably, the PROM 158 is, at least, a 16-bit device. However, unless the RAM 160 is used to determine the phase-locking information that is to be burned into the PROM 158, the RAM 160 may be an 8-bit device. Or, it may include even fewer bits, since it will need to store only frequency-correction information that supplements that of the PROM 158.

While the use of the PROM 158 has been shown and described in conjunction with FIG. 6, which is a variation of the FIG. 4 embodiment, it will be apparent that the same principles may be applied to other embodiments of frequency-hopping oscillators, such as those of FIGS. 4 and 7.

Referring now to FIG. 7, a frequency-hopping oscillator, or learning system, 170 includes parts that are like-named and like-numbered with those shown and described in conjunction with FIG. 4. In addition, the frequency-hopping oscillator 170 includes a phase-locked oscillator 172.

The phase-locked oscillator 172 includes a phase-locked loop 174 with a forward path 176 and the feedback path 120. An amplifier/offsetter 178 is in the forward path 176, as are parts that are like-numbered and like-named with those shown and described in conjunction with FIG. 4.

The phase-locked oscillator 172 also includes the digital integrator 146 of FIG. 4 and a digital lead compensator 180. The digital integrator 146 and the digital lead compensator 180 cooperate to provide a lead-compensated digital integrator 182.

The digital integrator 146 includes the pulse decoder 92, the parallel adder 94, and the RAM 96. The digital lead compensator 180 includes the pulse decoder 92 and a parallel adder 184.

Operation of the lead-compensated digital integrator 182 is as follows: the phase detector 76 produces UP and DOWN signals, the pulse decoder 92 produces plus one, minus one, and/or zero correction signals in accordance with UP signals, DOWN signals, and/or the absence of either an UP or a DOWN signal. The parallel adder 94 sums signals received from the pulse decoder 92, and the digital sums are stored in the RAM 96. These digitally stored sums, or digitally stored numbers are phase-locking information which, when D/A converted, become channelizing voltages.

When a digitally stored sum is recalled from the RAM 96, it is directed to the D/A converter 98 via the parallel adder 184 wherein lead compensation is added. In accordance with a digital number provided by the pulse decoder 92, the parallel adder 184 adds to, subtracts from, or leaves the same, the digitally stored number received from the RAM 96, thereby adding lead compensation to phase-locking information stored by, and recovered from, the RAM 96. Therefore, the voltage produced by the D/A converter 98 is a lead-compensated phase-locking voltage.

Referring now to FIGS. 4, 6, and 7, significant differences in these embodiments reside in the digital lead compensators, 84, 148, and 180. The frequency-hopping oscillators, 72 of FIG. 4 and 136 of FIG. 6, add lead compensation by analog summation in the combiner/offsetter 108, of a channelizing voltage and a lead-compensation voltage. In contrast, the frequency-hopping oscillator 170 of FIG. 7 adds lead compensation by digital summation of digitized phase-locking information and a digital lead-compensation signal in the parallel adder 184.

Figure 8:
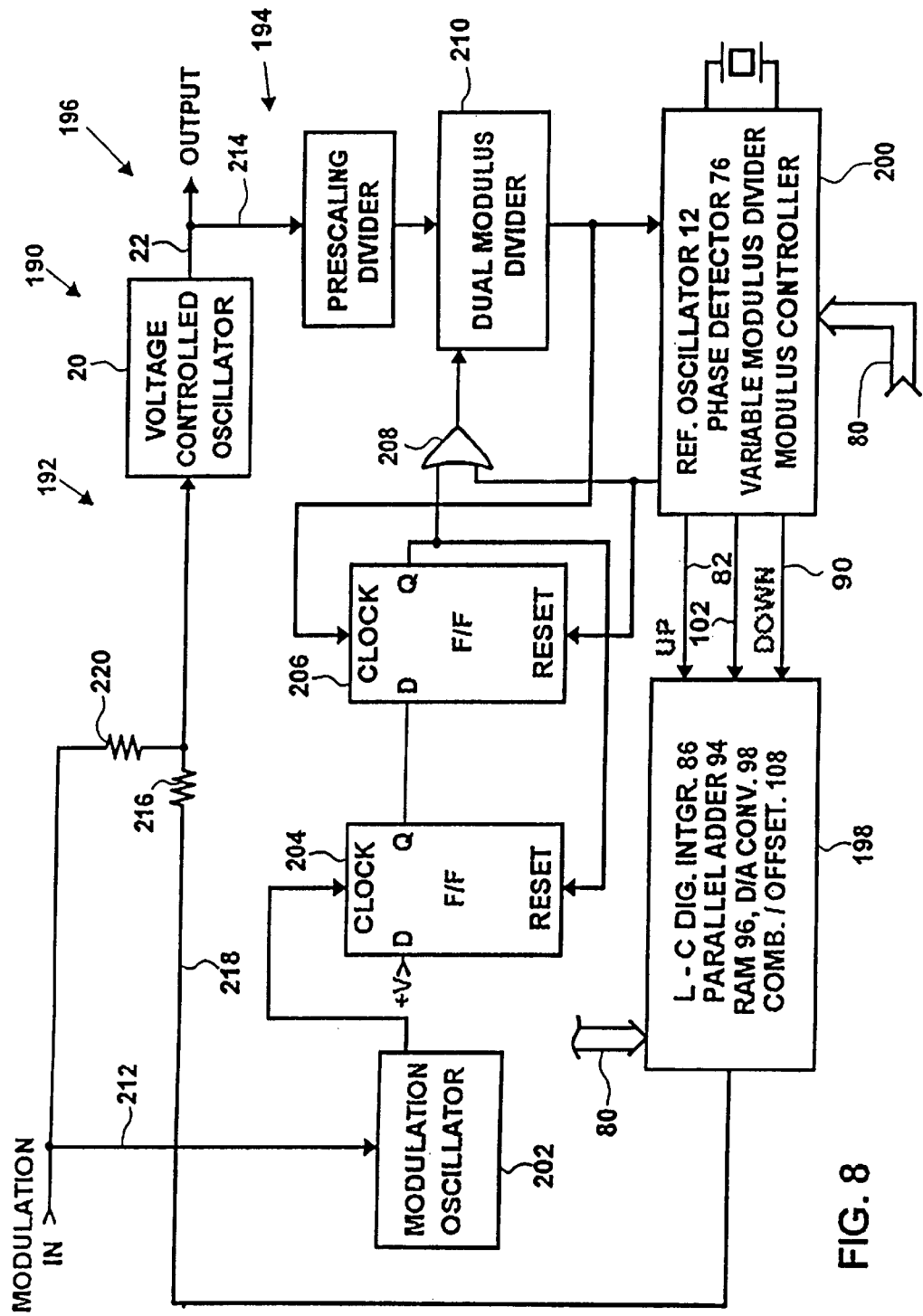
FIG. 8 is a modification of a prior-art patent, showing how ac and dc modulation may be added to the frequency-hopping oscillators of the present invention.

Referring now to FIG. 8, a frequency-hopping oscillator, or learning system, 190 illustrates how the frequency-hopping oscillators and the lead-compensated digital integrators of the present invention can be combined with any of the dc modulated phase-locked oscillators of the aforesaid Lautzenhiser patents.

The frequency-hopping oscillator 190 incorporates components of FIG. 6 of Lautzenhiser, U.S. Pat. No. 5,091,706, which includes a detailed description of FIG. 6. This Lautzenhiser patent is incorporated herein by reference thereto.

Referring again to FIG. 8, the frequency-hopping oscillator 190 may be ac and/or dc modulated. That is, both a forward path 192 and a feedback path 194 of a phase-locked oscillator 196 may be modulated by various means as taught in the aforesaid Lautzenhiser patents.

The frequency-hopping oscillator 190 of FIG. 8 includes a block 198 that represents components shown and described in conjunction with the frequency-hopping oscillator 72 of FIG. 4, as named and numbered in the block 198. That is, the block 198 represents inclusion of the lead-compensated digital integrator 86, the parallel adder 94, the RAM 96, the D/A converter 98, and the combiner/offsetter 108 in the forward path 192 of the frequency-hopping oscillator 190 of FIG. 8.

Attachment of the frequency-command conductors 80 to the RAM 96 of FIG. 4 is represented in FIG. 8 by connection of the frequency-command conductors 80 to the block 198; and connection of the frequency-command conductors 80 to the divider 78 of FIG. 4 is represented by connection of the frequency-command conductors 80 to a block 200 that contains components as named therein. Therefore, the forward path 192 is channelized as taught in conjunction with FIG. 4, and channelization of the feedback path 194 is achieved by the divider 78, as controlled by the frequency-command conductors 80, as taught in conjunction with FIG. 4.

Modulation of the feedback path 194 is accomplished by a modulation oscillator 202, a bistable multivibrator 204, another bistable multivibrator 206, an OR gate 208, and a dual-modulus divider 210, in response to a modulation voltage being supplied to the modulation oscillator 202 via a modulation conductor 212, as taught in conjunction with FIG. 6 in the aforesaid Lautzenhiser patent. The dual-modulus divider 210 is interposed into a feedback conductor 214.

Modulation of the forward path 192 is accomplished by interposing a summing resistor 216 into a forward path conductor 218, and supplying the modulation voltage of the modulation conductor 212 to the forward path conductor 218 is via a modulation resistor 220.

Returning now to the discussion of the embodiments of FIGS. 4, 6, and 7, phase-locking information is any information that will drive an output frequency approximately to a channelized frequency.

Frequency-correcting information is used to progressively correct phase-locking information, so that the corrected phase-locking information will drive an output frequency approximately to phase lock.

Generation of frequency-correcting information and phase-locking information is via a learning path 222 of FIG.

4, a learning path 224 of FIG. 6, and a learning path 226 of FIG. 7. Each learning path, 222, 224, or 226 includes components of a system that function together to provide both frequency-correction information and phase-locking information, thereby providing a learning system that compensates for lack in precision in proportionality and/or linearity and temperature drift in components that include analog inputs or outputs.

The learning path 222 of FIG. 4 includes the phase detector 76, the decoder 92, the parallel adder 94, the RAM 96, the D/A converter 98, the low-pass filter 100, the combiner/offsetter 108, the VCO 20, and the feedback path 120.

The learning path 224 of FIG. 6 includes the phase detector 76, the decoder 92, the parallel adder 162, the RAM 160, the parallel adder 164, the D/A converter 98, the low-pass filter 100, the combiner/offsetter 108, the VCO 20, and the feedback path 120.

The learning path 226 of FIG. 7 includes the phase detector 76, the decoder 92, the parallel adder 94, the RAM 96, the parallel adder 184, the D/A converter 98, the low-pass filter 100, the combiner/offsetter 108, the VCO 20, and the feedback path 120.

Figure 9:
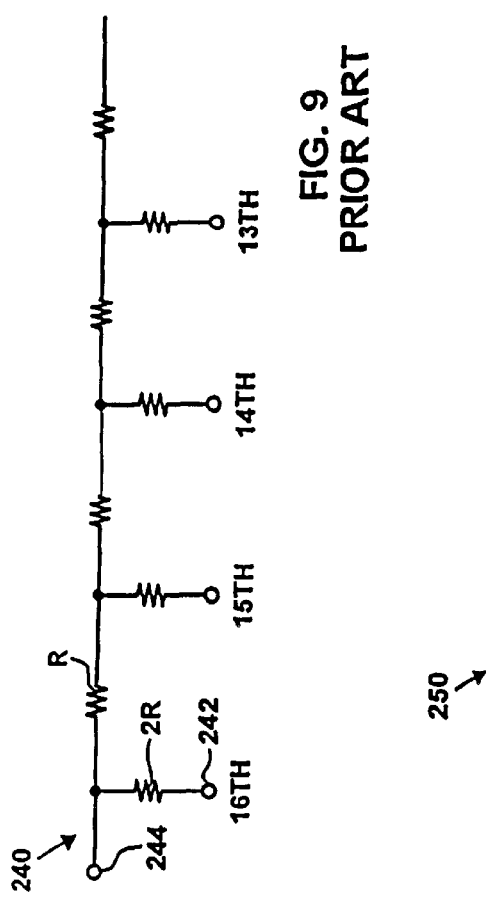
FIG. 9 is a schematic drawing of a conventional D/A converter that uses a ladder of R and 2R resistors.

Referring now to FIG. 9, a prior-art D/A converter 240 includes bits, or binary inputs, 242 for sixteen bits of binary-coded information, and an output voltage node 244. The D/A converter 240 includes a plurality of ladder resistors R and a plurality of bit resistors 2R. Each of the ladder resistors R have equal resistances. In like manner, all of the bit resistors 2R have equal resistances, but their resistances are twice the values of the resistances of the ladder resistors R.

Any combination of the binary inputs 242 may be connected selectively to 10.0 volts, or any other suitable voltage to represent the binary input 242 of 1, or connected to ground to represent the binary input 242 of 0. The resultant voltage output at the node 244 will be a function of the binary inputs 242, as determined by connecting selective ones of the binary inputs 242 to 10.0 volts or ground.

For example, with 10.0 volts applied to sixteen binary inputs 242, that is with sixteen binary inputs 242 equal to a binary 1, the maximum numerical input will be 65,535 which is one less than 2 to the 16th power, the theoretical maximum output voltage will be (10×65,535)/65,536= 9.999847, and the output voltage of the least significant bit (lsb) will be 10 volts divided by 65,536, which is equal to 0.0001523 volts.

Figure 10:
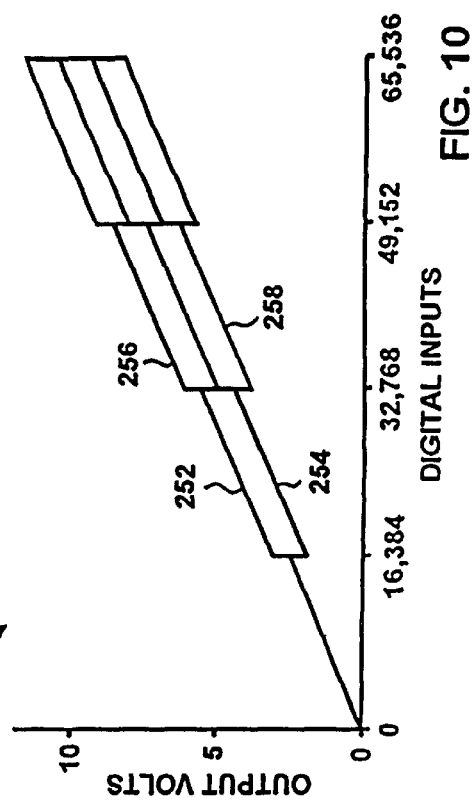
FIG. 10 is a diagram showing examples of variations in output voltages as caused by variations in resistances of the D/A converter of FIG. 9.

Referring now to FIG. 10, a voltage curve 250 illustrates some of the variations in output voltage vs. numerical input that commonly occur with the prior-art D/A converter 240 of FIG. 9.

While, in the discussion that follows, problems caused by error in resistances of the resistors 2R will be discussed, it should be apparent that the errors in the resistors R will also be involved, since each pair of resistors R and 2R outputs a voltage to the next higher bit.

For an input of 16,383, the first fourteen bits, or binary inputs, 242 are at 1. But for an input of 16,384, the fifteenth binary input 242 of FIG. 9 is at 1 and the fourteen binary inputs 242 that were at 1 are now at 0. Therefore, errors in resistances in the fourteen resistors 2R of FIG. 9 that had inputted 16,383 and whose errors in resistances may be accumulative either negatively or positively, are now connected to ground rather than to 10.0 volts, and the resistor 2R at the fifteenth bit 242 that represents 16,384 is connected to 10.0 volts.

Referring now to FIGS. 9 and 10, the change from the accumulative error of the fourteen resistors 2R of FIG. 9 that were connected to 10.0 volts to an error in the single, or fifteenth, resistor 2R being connected to the 10.0 volts may result in the voltage curve 250 of FIG. 10 stepping vertically up to a curve 252, or stepping vertically down to a curve 254 in response to a change from 16,383 to 16,384 in an input.

As a second example, for an input of 32,767, fifteen inputs 242 of FIG. 9 are at binary 1's. But for an input of 32,768, the sixteenth input 242 is a binary 1 and the fifteen inputs 242 that were at binary 1's are now 0's.

Therefore, errors in resistances in fifteen of the resistors 2R of FIG. 9, that may be accumulative either negatively or positively, are now replaced by the single resistor 2R at the sixteenth bit 242.

This change from the accumulative error of the fifteen resistors 2R to an error in the single, or sixteenth, resistor 2R may result in the voltage curve 250 of FIG. 10 stepping vertically up to a curve 256, or stepping vertically down to a curve 258 in response to a change from 32,767 to 32,768 in a numerical input.

Figure 11A:
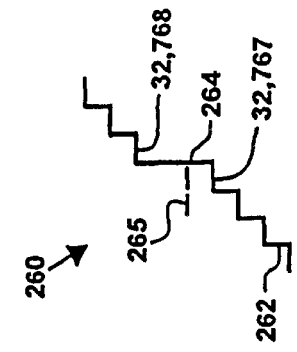
FIG. 11A is a diagram, in stepped form, showing that holes in output voltages of the D/A converter of FIG. 9 may be caused by variations in resistances of standard resistors.
Figure 11B:
FIG. 11B is a diagram, similar to FIG. 11A, but showing in stepped form that variations in resistances of standard resistors may result in duplicate digital addresses.

Referring now to FIGS. 11A and 11B, these figures are included to teach the same truths as FIG. 10, but illustrate them differently.

Rather than the voltage output of the prior-art D/A converter 240 being in the form of a smooth curve, as illustrated in FIG. 10, in actuality, a stepped output voltage curve 260 of FIG. 11A steps upwardly in theoretically equal voltage steps 262 with each increase in a numerical input.

As illustrated by the stepped output voltage curve 260 of FIG. 11A, an unduly large upward step 264 in an output voltage may occur when an input of 32,767 is increased to 32,768 and errors in fifteen resistors 2R are replaced by an error in the different resistor 2R of FIG. 9 at the sixteenth bit 242.

Therefore, in the illustration of FIG. 11A there is a hole between these two digital inputs in that the D/A converter 240 of FIG. 9 cannot produce a voltage step 265, which is shown by a phantom line, between inputs of 32,767 and 32,768. That is, a hole exists because the step 264, in the output voltage curve 260 in response to a digital increase of 1, is at least twice as large as the step 265.

Or, as illustrated in FIG. 11B, a downward step 266 in a stepped output voltage curve 268 may occur when an input is changed from 32,767 to 32,768 and errors in fifteen resistors 2R are replaced by an error in the different resistor 2R at the sixteenth bit 242. Downward steps 266 produce dual addresses which will be discussed in conjunction with FIG. 12B.

The output voltages of D/A converters, which actually are stepped, as shown in FIGS. 11A and 11B, may also be represented as smoothed curves, as in FIGS. 12A and 12B.

Referring now to FIG. 12A, an output voltage curve 270 of the prior-art D/A converter 240 of FIG. 9 shows how one or more holes may occur because of accumulative errors of the resistors 2R in lower bits, and replacement by the single resistor 2R in the next higher bit. In FIG. 12A, the output voltage jumps from an output voltage 272 to an output voltage 274 with an upward step 275 in response to a change in an input from 32,767 to 32,768, thereby leaving a hole, as discussed in conjunction with FIG. 11A.

Referring now to FIG. 12B, an output voltage curve 276 of the prior-art D/A converter 240 of FIG. 9 shows that accumulative errors in the resistors 2R may result in a decrease in an output voltage 278 to an output voltage 280 with an increase in an input from 32,767 to 32,768.

Therefore, accumulative errors in the resistors 2R, instead of producing an upward step in the output voltage, may produce a downward step 281. Thus, instead of producing holes, a D/A converter may include downward steps 281 that produce duplicate digital addresses, or dual digital addresses, 279A and 279B. A dual digital address refers to a phenomena in which a desired output voltage can be obtained by either of two different digital addresses. That is, output voltages that are produced in response to the two different digital inputs will be substantially equal.

As an example, in the output voltage curve 276, an output of 5.0 volts can be obtained by inputting a digital input of 32,668, or it can be obtained by inputting an input of 32,868. Thus, 32,668 and 32,868 are duplicate digital addresses, or dual digital addresses, in that they produce the same output voltage. In like manner, various voltages can be outputted in response to either of two inputs, as can be seen by inspection of FIG. 12B.

FIGS. 10, 11A, 11B, 12A, and 12B have been labeled as prior art, since they illustrate upward and downward steps that commonly occur in digital-to-analog converters, because of resistor tolerances. However, FIGS. 11B and 12B, and especially FIG. 12B, also illustrate the present invention. That is, downward steps 281 of the magnitude illustrated in FIG. 12B are used to prevent upward steps 275 of the magnitude shown in FIG. 12A when extremely-loose resistor tolerances are used to construct the nonlinear D/A converter 282 of FIG. 13.

In the example of a 16-bit converter with an input voltage of 10.0 volts, since a hole occurs when the output voltage increases twice as much as it should for an increase of one in the digital input, a hole would occur if the output voltage increased by 0.00031 volts in response to a digital increase of one. And yet, as shown in FIG. 12B, downward steps 281, even greater than one volt, can be used to prevent holes when extremely-loose resistor tolerances are used.

Referring now to FIG. 13, a nonlinear D/A converter, or nonlinear digital-to-analog converter 282 of the present invention includes a plurality of the ladder resistors R, three of which are labeled R16, R15, and R14 to identify them with their respective bits, and a plurality of the bit resistors 2R, three of which are labeled 2R16, 2R15, and 2R14 to identify them with their respective bits.

The ladder resistors R are arranged as shown, with resistances of resistors 2R nominally being twice as large as resistances of the bit resistors R, as described in conjunction with FIG. 9, a plurality of the binary inputs 242, and the output voltage node 244. However, in addition to the ladder resistors R and the bit resistors 2R of FIG. 13, the nonlinear D/A converter 282 of FIG. 13 includes a plurality of resistors ΔR, three of which are labeled ΔR16, ΔR15, and ΔR14 to identify them with their respective bits. Thus, while the ladder resistors R of FIGS. 9 and 13 are the same, as described herein, bit resistors of FIG. 13 include both the resistors R of FIGS. 9 and 13 and the resistors ΔR of FIG. 13.

For the sake of simplicity, for the discussion that follows, reference to resistors will be made without individual bit designation. That is, R, 2R, and ΔR will be used to refer to resistors for all bits.

This series arrangement of resistors 2R with resistors ΔR illustrates the use, in an actual design, of resistors 2R with resistances, whether fixed or variable, that are greater than twice the resistance of the resistors R.

The effect of increasing the resistances of the resistors 2R, is to insert dual addresses, as shown in FIG. 12B, at each bit 242 wherein the resistances of the respective resistors 2R have been increased, thereby eliminating any possibility of holes.

As can be appreciated, as the number of bits 242 increase in response to increasing binary inputs 242, and the number of resistors 2R that are used to convert a number increases, accumulative errors in the resistors 2R can cause holes that more seriously effect D/A conversion.

Therefore, while it may not be necessary to use the resistors ΔR for all bits, a sufficient number must be included to prevent holes, or to avoid the expense of providing, or matching, the resistors precisely enough to prevent holes.

Ideally, each higher bit will produce a slightly smaller voltage than the sum of all smaller bits. Thus, it can be seen that resistances of each of the resistors ΔR will not necessarily be equal. And, since the resistances of the ΔR resistors merely symbolize increasing resistances of the resistors 2R, it becomes apparent that resistances of the resistors 2R may not be equal.

Optionally, rather than increasing resistances of the resistors 2R, decreasing resistances of some, or all, of the resistors R will also produce a nonlinear D/A converter as taught herein. And, it becomes apparent that the resistances of all of the resistors R may not necessarily be equal. Instead, in accordance with individualized design criteria, resistances of all of the resistors, R and 2R, may be selected by a computer analysis.

In summary, the nonlinear D/A converter 282 of FIG. 13 converts N bits of information, using N ladder resistors, and N bit resistors. The ratio of resistances of the bit and ladder resistors are proportioned to make an output voltage of any of a plurality of adjacent ones of the bits less than twice as high as each of the respective next-lower bits. And, these less-than-twice relationships are made sufficiently high that selected resistor tolerances cannot obliterate any of the less-than-twice relationships.

Referring now to FIG. 14, the objective of prior-art D/A converters has been to convert inputs, in binary form, to output voltages that increase linearly with an increase in the digital input, as illustrated by an output voltage curve 284. However, as shown and described above, it has been difficult to produce D/A converters that do not have holes, as illustrated in FIGS. 11A and 12A, as the number of bits has increased beyond twelve.

In contrast to prior-art D/A converters in which output linearity has been the design criteria, the present invention provides a nonlinear D/A converter in which holes are eliminated and dual addresses are provided for one or more of the higher bits irrespective of resistor tolerances, manufacturing cost is minimized, and the number of bits can be increased beyond normal limitations without incurring holes or requiring ultra-precision resistors.

Referring now to FIG. 15, instead of producing the output voltage curve 284 of FIG. 14 that is a straight line, as is the design goal of the prior-art D/A converter 240 of FIG. 9, the D/A converter 282 of FIG. 13 produces an output voltage curve 286 that slopes downwardly as digital inputs increase.

Further, in prior-art D/A converters, the voltage steps 262 of FIG. 11A are designed to be equal. Thus, each higher bit produces twice the output voltage of the next lower bit. In contrast, in the present invention, for bits 242 of FIG. 13 wherein resistors ΔR are included, each higher bit produces an output voltage that is less than twice that of the next lower bit, irrespective of resistor tolerances.

Finally, in prior-art D/A converters, when a 1 at a higher bit replaces all 1's of all lower bits, the design objective is for a voltage output to increase by the voltage step 262 of FIG. 11A. In contrast, in the present invention, a design objective is to produce a lower output voltage when a 1 for a higher bit replaces 1's for all lower bits, irrespective of resistor tolerances.

In some applications, such as learning systems, including the frequency-hopping oscillators 72 of FIG. 4, 136 of FIG. 6, 170 of FIG. 7, and 190 of FIG. 8, the presence of holes in the D/A converter 98 can cause the phase-locked oscillator 74, 152, 172, or 196 to "hunt." That is, at one input both the output voltage and the output frequency of the VCO 20 will be too low to phase lock, and at the very next higher input both an output voltage and a resultant output frequency of the VCO 20 will be too high.

While the voltage output of the D/A converter 282 is intentionally nonlinear, it should be recognized that, in learning systems, such as the frequency-hopping oscillators 72, 136, 170 and 190, nonlinearity of components, such as the D/A converter 98, has no effect on the precision of the system. In contrast, holes in the voltage output can degrade preciseness of any learning system seriously and even result in malfunction.

The D/A converter 282 of FIG. 13 may be constructed with resistances of resistors R increased by resistances of resistors ΔR for all sixteen bits 242. If so, resistors that are less precise than those commonly used in 12-bit D/A converters, and therefore more economical, can be used.

Or, since it is not particularly difficult or expensive to build 12-bit D/A converters that do not contain holes, the present invention may be practiced by custom manufacturing 16-bit, or greater, D/A converters in which only the higher bits include resistances that are equal to resistors R plus resistors ΔR.

Figure 16:
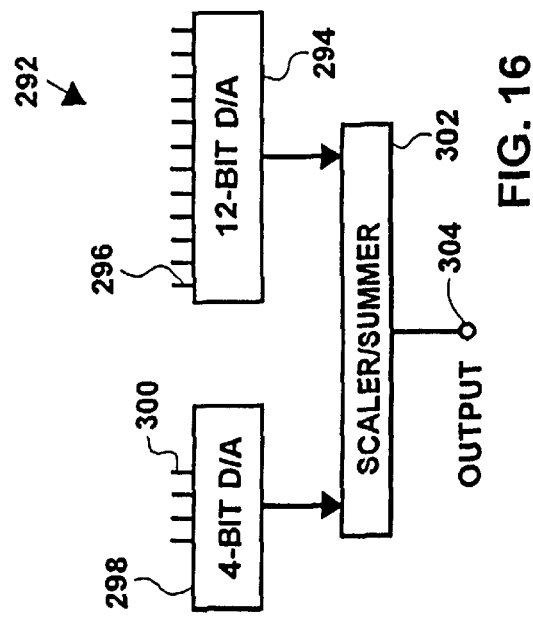
FIG. 16 is a block diagram of an embodiment of the nonlinear D/A converter of the present invention in which output voltages of 12-bit and 4-bit D/A converters are proportionally summed to provide nonlinearity.

Referring now to FIG. 16, a 16-bit nonlinear D/A converter, or 16-bit nonlinear digital-to-analog converter 292 includes a 12-bit D/A converter, or 12-bit digital-to-analog converter 294 with twelve lower bits, or twelve binary inputs, 296, a 4-bit D/A converter, or 4-bit digital-to-analog converter 298 with four higher bits, or four higher binary inputs, 300, an analog scaler/summer 302, and an output node 304.

First, assume that the 16-bit nonlinear D/A converter 292 is an ideal D/A converter 240 as described in conjunction with FIG. 9, and assume an input of 65.536 volts. Since there are 65,536 steps in a 16-bit D/A converter, each step would be 1.0 millivolt.

A maximum voltage output of the 12-bit D/A converter 294 occurs when all twelve inputs 296 are a binary 1. At this time, the input is 4,095. Therefore, the output voltage is 4,095 bits×1.0 millivolt per bit=4.095 volts.

When separate ones of the thirteenth, fourteenth, fifteenth, and sixteenth bits 300 are at a binary 1, the inputs are 4,096, 8,192, 16,384, and 32,768, respectively. Thus, it can be seen that each of the four higher binary inputs 300 doubles the output voltage.

It follows that, if the 12-bit D/A converter 294 produces less than 4.095 volts with all inputs at 1, there will be a hole when the binary input is increased by one, and a 1 at the thirteenth bit 300 of the 4-bit D/A converter 298 replaces twelve bits 296 of the 12-bit D/A converter 294.

However, in the 16-bit nonlinear D/A converter 292 of FIG. 16, the analog scaler/summer 302 is used to scale an output voltage in the output node 304 of the 4-bit D/A converter 298 to any suitable value lower than 4.096 volts.

For instance, if the analog scaler/summer 302 decreases the steps produced by the 4-bit D/A converter 298 from 4.096 volts to 3.0 volts, as 3.0 volt increments are added to output voltages of the 12-bit D/A converter 294 that extend up to a maximum of approximately 4.095 volts, any possibility of holes in the four higher bits 300 is eliminated.

Instead of the possibility of any holes, there are duplicate digital addresses that will produce the same output voltages, similar to those shown and described in conjunction with FIG. 11B.

In the example above, to reach any output voltage between 3.0 and 4.095, the 4-bit D/A converter 298 can have an output of either 0.0 or 3.0 volts. If the output of the 4-bit D/A converter 298 is 0.0 volts, the output of the 12-bit D/A converter 294 will range from 0.0 to 4.095 volts, but if the output of the 4-bit D/A converter 298 is 3.0 volts, the output of the 12-bit D/A converter 294 will range from 0.0 to 1.095 volts.

Referring now to FIG. 17, a 16-bit nonlinear D/A converter, or 16-bit nonlinear digital-to-analog converter 310 includes both a 12-bit D/A converter, or 12-bit digital-to-analog converter 312 of conventional design and a 4-bit D/A converter, or 4-bit digital-to-analog converter 314 of conventional design.

The 12-bit D/A converter 312 serves as the first twelve bits of the 16-bit nonlinear D/A converter 310, and the 4-bit D/A converter 314 serves as the thirteenth to sixteenth bits, so that the first bit of the 4-bit D/A converter 314 is the thirteenth bit of the 16-bit nonlinear D/A converter 310.

The 12-bit D/A converter 312 and the 4-bit D/A converter 314 are connected as shown by resistors R, 13.5 R, and 27.0 R, and a summing junction 316, where numbers associated with each resistor indicates its resistance in proportion to the other resistors.

The resistors R, 13.5 R, and 27.0 R provide a voltage summer, or proportional summer, 318, that proportionally sums output voltages of the 12-bit D/A converter 312 and the 4-bit D/A converter 314, producing at the summing junction 316, 1/15 of any output voltage of the 12-bit D/A converter 312, and 9/10 of any output voltage of the 4-bit D/A converter 314.

Therefore, assuming a 15.0 volt input, and assuming that the 12-bit D/A converter 312 is adjusted to produce 15.0 volts when all twelve inputs are 1's, 1.0 volts will be produced at the summing junction 316 and an output terminal 320.

Continuing to refer to FIG. 17, when all twelve inputs are 1's, the input is 4,095. When the input increases by one to 4,096, all eleven of the inputs of the 12-bit D/A converter 312 go to 0's, and the first bit of the 4-bit D/A converter 314, which is the thirteenth bit of the 16-bit nonlinear D/A converter 310, goes to a 1.

Assuming a 15.0 volt input to the 4-bit D/A converter 314, and assuming that the 4-bit D/A converter 314 is adjusted to produce 15.0 volts when all four inputs are 1's, the first bit of the 4-bit D/A converter 314 will produce 1/15 of 15.0 volts, or 1.0 volts. After being reduced as a factor of 9/10 by the proportional summer 318, 0.9 volts will be produced at the summing junction 316 and the output terminal 320.

Therefore, when an input is increased from 4,095, wherein all inputs are 1's, to an input of 4,096, wherein the first twelve inputs are 0's and the thirteenth input is a 1, an output voltage in the summing junction 316 and the output terminal 320 steps down from 1.0 to 0.9 volts, providing dual addresses as shown in FIG. 12B.

The downward step 281 in the output voltages, as shown in FIG. 12B, and developing of a dual address, repeats each time an input of the 12-bit D/A converter 312 changes from all 1's to all 0's, and an input of the 4-bit D/A converter 314 increases by 1. Thus, for each of the fifteen digital inputs of the 4-bit D/A converter 314 there will be the downward step 281.

When all sixteen inputs of the 16-bit D/A converter 310 are 1's, the 12-bit D/A converter 312 produces 1/15 of 15.0 volts, or 1.0 volts at the summing junction 316. And the 4-bit D/A converter 314 produces 9/10 of 15.0 volts, or 13.5 volts at the summing junction 316. So with all sixteen inputs at 1's, the 16-bit D/A converter 310 produces 14.5 volts.

Referring now to FIG. 18, a maximum output voltage of a conventional D/A converter is approximately 15.0 volts for an input of 15.0 volts, as shown by a linear output voltage curve 324. The linearity of the curve 324 can be seen in the fact that the curve 324 intersects corners 326 of grids 328.

Referring now to FIG. 19, even though downward steps 330, as labeled in FIG. 19A, are only 0.1 volts for each of the digital addresses of the 4-bit D/A converter 314, in a nonlinear output voltage curve 332 of FIG. 19, the magnitude of downward steps 330 is exaggerated for the purpose of clearly illustrating nonlinearity. The fact that the output voltage curve 332 of FIG. 19 is nonlinear can be seen by the fact that the curve 332 progressively falls farther below corners 326 that are aligned with a phantom line 334.

Referring now to FIG. 20, if the 12-bit D/A converter 312 was adjusted to produce 1.1 volts at the summing junction 316 in response to a binary input of twelve 1's, and the 4-bit D/A converter 314 was adjusted to produce 1.0 volts at the summing junction 316 for each of the fifteen inputs that are possible with four bits, the downward steps 330 would occur in response to all fifteen inputs as in FIG. 19, but an output voltage curve 336 would slope upward somewhat more steeply, rising slightly over successive ones of the corners 326, and stepping downward to successive ones of the corners 326.

As described in conjunction with FIG. 20, since the 4-bit D/A converter 314 will produce 1.0 volts for each of the fifteen numerical inputs for a total of 15.0 volts, and the 12-bit D/A converter 312 will produce 1.1 volts when all twelve inputs are 1's, the maximum output voltage will be 16.1 volts, very close to the output voltage of a conventional D/A converter with a 15.0 volt input.

However, even though the output voltage curve 336 approximates linearity, it is nonlinear, because of the downward steps 330.

In the 16-bit D/A converter 310 of FIG. 17, and in the embodiments of FIGS. 21 and 22, which will be described subsequently, the downward steps 330 are designed to be sufficiently large that they, and the aforementioned characterizing features of the present invention, are maintained consistently in production lots of nonlinear D/A converters irrespective of any normal variations in resistor or other component tolerances, and in spite of any normal accumulation of tolerances, in all bits designed to include the downward steps 330.

Figure 21:
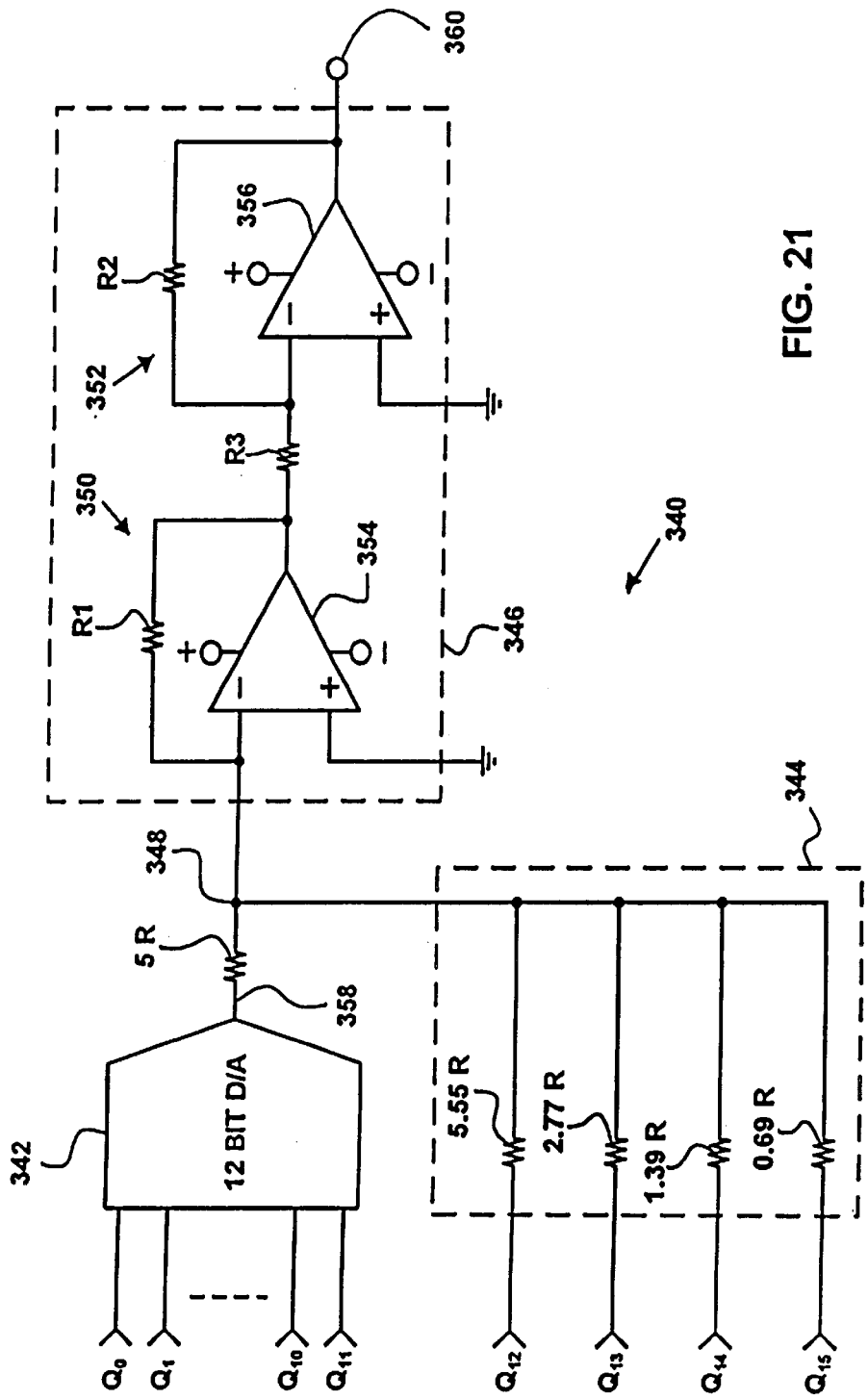
FIG. 21 is a schematic diagram of an embodiment of the nonlinear D/A converter of the present invention in which current summing is used to achieve nonlinear output voltages.

Referring now to FIG. 21, a 16-bit nonlinear D/A converter, or 16-bit nonlinear digital-to-analog converter 340 includes a 12-bit D/A converter, or 12-bit digital-to-analog converter 342 with inputs Q0 through Q11 that correspond to bits 1 through 12, a 4-bit D/A converter, or 4-bit digital-to-analog converter 344, as indicated by a like-numbered phantom line, that includes inputs Q12 through Q15 that correspond to bits 13 through 16, a current summer 346, and a resistor 5R.

The 4-bit D/A converter 314 includes resistors 5.55 R, 2.77 R, 1.39 R, and 0.69 R that are connected to a summing junction 348, as shown. The numbers associated with each resistor indicates the relative resistance, one with another.

The current summer 346 includes a summer/inverter 350 and an inverter 352. The summer/inverter 350 includes an operational amplifier 354 and a feedback resistor R1. The inverter 352 includes an operational amplifier 356 and a feedback resistor R2. The operational amplifiers, 354 and 356, are connected by a resistor R3, where the suffix numbers, 1, 2, and 3, distinguish individual resistors of equal resistances. The operational amplifiers, 354 and 356, are connected to positive and negative source voltages, as shown.

First, assume that: all inputs, Q0 through Q11, of the 12-bit D/A converter 342 are all 1's with a 5.0 volt dc reference, inputs Q12 through Q15 of the 4-bit D/A converter 344 are at 0.0 volts dc and open, and a voltage in an output conductor 358 of the 12-bit D/A converter 342 is +5.0 volts dc.

However, since the resistor 5R is interposed between the 12-bit D/A converter 342 and the summing junction 348, the gain of the summer/inverter 350 is 1R/5R or 0.2, so that 1.0 volts dc is fed to the inverting input of the operational amplifier 354. After being inverted by the summer/inverter 350, and again being inverted by the inverter 352, +1.0 volts dc is produced at an output terminal 360.

For this output of +1.0 volts dc, the numerical input was 4,095. Increasing the input to 4,096 changes all twelve inputs Q0 through Q11 of the 12-bit D/A converter 342 to 0.0 volts, and changes input Q12 of the 4-bit D/A converter 344 to 1.

Assuming a +5.0 volt dc input to input Q12, the gain of the summer/inverter 350, with respect to input Q12 is 0.18, so the summer/inverter 350 outputs a negative 0.9 volts, which, after a second inverting by the inverter 352, produces +0.9 volts in the output conductor 358.

Therefore, referring again to FIG. 19A, the downward step 330 of 0.1 volts is provided from a change in input from 4,095 to 4096, which is identical to that described in conjunction with FIG. 17.

In like manner, every time twelve 1's at inputs Q0 through Q11 are replaced by twelve 0's, the downward step 330 of 0.1 volts is developed, thereby producing dual addresses as shown in FIG. 12B.

When inputs Q12 through Q15 are all at a binary 1, the parallel-connected resisters 5.55 R, 2.77 R, 1.39 R, and 0.69 R, and +13.5 volts is produced at the output terminal 360. And, when all inputs, Q0 through Q15 are a binary 1, the 12-bit D/A converter 342 adds 1.0 volts, as described above, so that the 16-bit nonlinear D/A converter 340 produces a maximum output of 14.5 volts which is identical to the maximum output voltage for the embodiment of FIG. 17.

Figure 22:
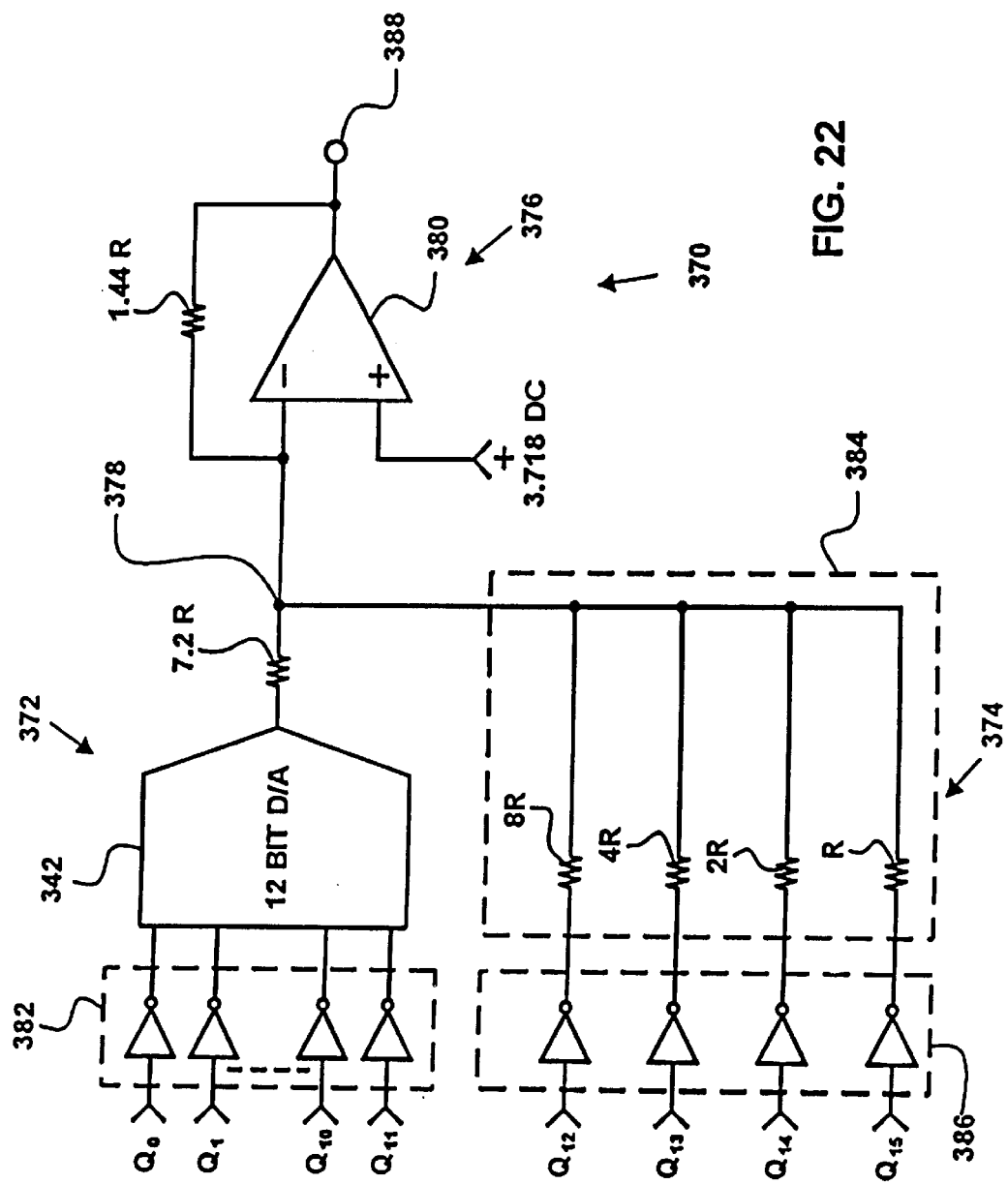
FIG. 22 is a schematic diagram of an other embodiment of the nonlinear D/A converter of the present invention in which current summing is used to achieve nonlinear output voltages, and optionally, inverters are used to eliminate negative logic.

Referring now to FIG. 22, a 16-bit nonlinear D/A converter, or 16-bit nonlinear digital-to-analog converter 370 includes a 12-bit inverting D/A converter, or 12-bit inverting digital-to-analog converter 372, a 4-bit inverting D/A converter, or 4-bit inverting digital-to-analog converter 374, a proportional summer, or current summer 376, a summing junction 378, and a resistor 7.2 R.

The current summer 376 includes an operational amplifier 380 that is connected to a positive source and to ground, as shown, a feedback resistor 1.44 R, and an input to the positive input terminal of 3.718 volts.

The 12-bit inverting D/A converter 372 includes the 12-bit D/A converter 342 of FIG. 12 and a 12-bit inverter 382. The 4-bit inverting D/A converter 374 includes a 4-bit D/A converter, or 4-bit digital-to-analog converter 384 and a 4-bit inverter 386. The 4-bit D/A converter 384 includes resistors 8R, 4R, 2R, and R, where the prefix numbers indicate relative resistances.

While, optionally, the 12-bit inverter 382 and the 4-bit inverter 386 may be eliminated, the resultant device would function with negative logic.

First assume a source of 5.0 volts dc. For an input of 4,095, inputs Q0 through Q11 are 1's, the output of the 12-bit D/A converter 372 decreases from 5.0 volts to 0.0 volts, and an output of the proportional summer 376, at an output terminal 388, increases from 0.0 to 1.0 volts due to the 0.2 times inverting gain of the proportional summer 376.

When the input is increased from 4,095 to 4,096, inputs Q0 through Q11 go to 0's, and input Q12 goes to a 1. At this time, inputs Q0 through Q11 do not provide any output voltage to the output terminal 388. However, with 5.0 volts applied to input Q12, the output of the proportional summer 376 goes to 0.9 volts.

Therefore, as also described for the embodiments of FIGS. 17 and 21, the 16-bit nonlinear D/A converter 370 provides downward steps 330 of 0.1 volts, as shown in FIGS. 19, 19A, and 20, each time inputs Q0 through Q11 go to 0's, and an input to Q12 through Q15 increases by 1. Since the 4-bit D/A converter 384 has fifteen inputs that are 1's, fifteen downward steps 330 are produced. And, as also described in conjunction with FIGS. 17 and 21, the 16-bit nonlinear D/A converter 370 of FIG. 22 provides a maximum output of 14.5 volts when all sixteen inputs, Q0 through Q15, are 1's.

In the preceding descriptions, the outputs of the 4-bit D/A converters, 314, 344, and 374 have been reduced to produce the downward steps 330. Optionally, the outputs of the 12-bit D/A converters 312, 342, and 372 may be increased as taught in conjunction with FIG. 20, thereby, at least partially, providing the downward steps 330 by increasing outputs of the 12-bit D/A converter 312, 342, or 372.

Referring again to FIGS. 16, 17, 21, and 22, outputs of two D/A converters are proportionally summed. In the embodiment of FIG. 17, the D/A converter outputs are voltage summed, and in the embodiments of FIGS. 21 and 22, the D/A converter outputs are current summed.

In any of the embodiments of the nonlinear D/A converters taught herein, even if low quality resistors are used, if voltage outputs are scaled as taught herein, D/A converters can be constructed with any desired number of bits without any danger of holes existing in output voltages.

Referring again to FIG. 13, alternately, rather than changing resistances of resistors R and/or 2R, input voltages to some of the higher bits 242 can be scaled.

Adaptive or learning systems, or any other electronic system that utilize a D/A converter, can practice the present invention by scaling output voltages for some of the higher bits, or all of the bits, by any of the means taught herein.

In summary, the nonlinear D/A converters 282, 292, 310, 340, and 370 of the present invention can be characterized by method steps as: being intentionally nonlinear; preventing holes in output voltages; providing dual addresses; making a voltage output of one bit less than twice the next lower bit; making an output voltage of a higher bit less than a total output voltage of all lower bits; making an output voltage of one numerical input greater than an output voltage of the next higher numerical input; and/or interjecting downward steps 281 and 330; all irrespective of component variables.

However, only the nonlinear D/A converter 282 of FIG. 13 can be characterized as producing an output voltage from each of a plurality of adjacent bits that is less than twice that of each respective next-lower bit, irrespective of component, or resistor, tolerances.

The present invention provides not only improved phase-locked oscillators, improved frequency-hopping oscillators, lead-compensated digital integrators, and improved D/A converters in which holes are eliminated, but also adaptive phase-locked oscillators and frequency-hopping oscillators with lead-compensated digital integrators and D/A converters that are free from holes.

Lautzenhiser, U.S. patent application Ser. No. 09/540,352, filed Mar. 31, 2000, and Lautzenhiser, U.S. Patent Ser. No. 09/353,406, filed Jul. 15, 1999 are incorporated herein by reference thereto.

While specific apparatus and method have been disclosed in the preceding description, and while part numbers have been inserted parenthetically into the claims to facilitate understanding of the claims, it should be understood that these specifics have been given for the purpose of disclosing the principles of the present invention and that many variations thereof will become apparent to those who are versed in the art. Therefore, the scope of the present invention is to be determined by the appended claims, and without any limitation by the part numbers inserted parenthetically in the claims.

What is claimed is:

1. A method for rapidly and accurately producing channelized frequencies which comprises:
   a) repeatedly phase detecting;
   b) producing UP and DOWN signals in response to said repeated phase detecting steps;
   c) integrating digital channelizing information for one of said channelized frequencies as a function of said UP and DOWN signals;
   d) driving an output frequency toward phase lock in response to said digital channelizing information; and
   e) offsetting said output frequency in a leading direction during said driving step.

2. A method for phase locking an output frequency to a reference frequency which comprises:
   a) repeatedly phase detecting;
   b) producing UP and DOWN signals as a function of said repeated phase detecting steps;
   c) integrating digital phase-locking information as a function of said UP and DOWN signals;
   d) decoding digital lead-compensation information as a function of said UP and DOWN signals; and
   e) driving said output frequency to phase lock in response to both said phase-locking information and said lead-compensation information.

3. A method as claimed in claim 2 in which said driving step comprises digital-to-analog converting said phase-locking information and said lead-compensation information.

4. A method as claimed in claim 2 in which said driving step comprises digitally summing said phase-locking information and said lead-compensation information.

5. A method as claimed in claim 2 in which said driving step comprises analog summing said phase-locking information and said lead-compensation information.

6. A method for phase locking an output frequency to a reference frequency which comprises:

a) repeatedly phase detecting;

b) producing UP and DOWN signals as a function of said repeated phase detecting steps;

c) decoding plus one, minus one, and zero correction signals from said UP and DOWN signals;

d) algebraically-summing said plus one, minus one, and zero correction signals into digital phase-locking information;

e) decoding digital lead-compensation information from said UP and DOWN signals; and f) driving said output frequency in response to both said phase-locking information and said digital lead-compensation information.

7. A method as claimed in claim 6 in which said driving step comprises digital-to-analog converting said phase-locking information and said lead-compensation information.

8. A method as claimed in claim 6 in which said driving step comprises digitally summing said phase-locking information and said lead-compensation information.

9. A method as claimed in claim 6 in which said driving step comprises analog summing said phase-locking information and said lead-compensation information.

10. A method as claimed in claim 1 in which:

a) said method further comprises decoding digital plus one, digital minus one, and digital zero correction signals, from said UP and DOWN signals; and b) said integrating step comprises algebraically summing said digital plus one, said digital minus one, and said digital zero correction signals at a clock frequency.

11. A method for rapidly phase locking an output frequency to a selected frequency which comprises:

a) recalling previously-stored digital information for phase locking said output frequency to said selected frequency;

b) driving said output frequency toward phase lock with said selected frequency in response to said recalled digital information;

c) offsetting said output frequency in a leading direction during said driving step;

d) adaptively correcting said recalled digital information, as a function of a phase difference between said output frequency and said selected frequency, subsequent to said driving step; and e) digitally storing said adaptively-corrected digital information.

12. A method as claimed in claim 11 in which said method further comprises repeatedly repeating said recalling, driving, adaptive correcting, and digital storing steps.

13. A method as claimed in claim 11 in which said method further comprises repeating said adaptive correcting step at a clock frequency.

14. A method as claimed in claim 11 in which said method further comprises repeating said recalling, driving, adaptive correcting, and digital storing steps at a clock frequency.

15. A method as claimed in claim 11 in which said offsetting step comprises producing an UP signal, a DOWN signal, or a simultaneous UP and DOWN signal as a function of a phase difference between said selected frequency and said output frequency.

16. A method as claimed in claim 11 in which said offsetting step comprises producing a digital plus one, a digital minus one, or a digital zero as a function of a phase difference between said selected frequency and said output frequency.

17. A method as claimed in claim 11 in which said offsetting step comprises:

a) producing a digital plus one, a digital minus one, or a digtal zero as a function of a phase difference between said selected frequency and said output frequency; and b) digital-to-analog converting said digital plus one, said digital minus one, or said digital zero.

18. A method as claimed in claim 11 in which said offsetting step comprises:

a) producing a digital plus one, a digital minus one, or a digital zero as a function of a phase difference between said selected frequency and said output frequency; and b) parallel adding said digital plus one, said digital minus one, or said digital zero to said recalled digital information.

19. A method as claimed in claim 11 in which said offsetting step comprises:

a) producing an UP signal, a DOWN signal, or a simultaneous UP and frequency and said output frequency; and b) converting said UP signal, said DOWN signal, or said simultaneous UP and DOWN signal into one of three different offsetting voltages.

20. A method as claimed in claim 11 in which said offsetting step comprises digital-to-analog converting.

21. A method as claimed in claim 11 in which said offsetting step comprises parallel adding.

22. A method as claimed in claim 11 in which said adaptive correcting step comprises producing an UP signal, a DOWN signal, or a simultaneous UP and DOWN signal.

23. A method as claimed in claim 11 in which said adaptive correcting step comprises:

a) producing an UP signal, a DOWN signal, or a simultaneous UP and DOWN signal; and b) converting said UP signal, said DOWN signal, or said simultaneous UP and DOWN signal into a digital plus one, a digital minus one, or a digital zero.

24. A method as claimed in claim 11 in which said adaptive correcting step comprises producing a digital plus one, a digital minus one, or a digital zero.

25. A method as claimed in claim 11 in which said adaptive correcting step comprises:

a) producing a digital plus one, a digital minus one, or a digital zero;

b) parallel adding said digital plus one, said digital minus one, or said digital zero to said recalled digital information.

26. A method as claimed in claim 11 in which said driving step comprises:

a) digital-to-analog converting bits of said recalled digital information; and b) making voltages of each of a plurality of adjacent ones of said bits less than twice those produced by respective lower ones of said bits, irrespective of component tolerances.

27. A method which comprises:

a) developing digital information for driving an output frequency to approximate phase lock with a selected frequency;

b) storing said developed digital information;

c) recalling said stored digital information;

d) digital-to-analog converting bits of said recalled digital information;

e) driving said output frequency toward said phase lock in response to said converted bits of said digital information; and f) said digital-to-analog converting step comprises preventing holes in an output voltage produced by said digital-to-analog converting step.

28. A method as claimed in claim 27 in which said prevention step comprises making voltages of each of a plurality of adjacent bits less than twice those produced by respective lower ones of said bits, irrespective of component tolerances.

29. A method for phase locking an output frequency to a reference frequency which comprises:
   a) comparing a feedback frequency with said reference frequency;
   b) producing a signal, in response to said comparing step, that indicates whether said output frequency is too high, too low, or at phase lock;
   c) digitally integrating said signal;
   d) driving said output frequency toward said phase lock in response to said digitally-integrated signal;
   e) lead compensating said output frequency during said driving step; and
   f) said driving and lead compensating steps comprise digital-to-analog converting.

30. A method as claimed in claim 29 in which said digital integrating step comprises repeatedly storing, recalling, and parallel adding a digital plus one, a digital minus one, or a digital zero.

31. A method as claimed in claim 29 in which said digital integrating step comprises storing, recalling, and parallel adding a digital plus one, a digital minus one, or a digital zero at a clock frequency.

32. A method as claimed in claim 29 in which:
   a) said producing step comprises producing an UP signal, a DOWN signal, or a simultaneous UP and DOWN signal; and
   b) said driving and said lead compensating steps compromise separately decoding said UP signal, said DOWN signal, or said simultaneous UP and DOWN signal into a digital plus one, a digital minus one, or a digital zero.

33. A method as claimed in claim 29 in which said lead compensating step and said digital-to-analog converting step comprises digital-to-analog converting directly from said produced signal.

34. A method as claimed in claim 29 in which said lead compensating step comprises:
   a) decoding said produced signal; and
   b) parallel adding said decoded signal to said digitally-integrated signal.

35. A method as claimed in claim 29 in which said digital-to-analog converting step comprises preventing holes in an output voltage produced by said digital-to-analog converting step.

36. A method as claimed in claim 29 in which said digital-to-analog converting step comprises making voltages of each of a plurality of adjacent bits less than twice those produced by respective lower ones of said bits, irrespective of component tolerances.

37. A method for phase locking an output frequency to a reference frequency which comprises:
   a) comparing a feedback frequency with said reference frequency;
   b) producing a digital plus one, a digital minus one, or a digital zero, in response to said comparing step, depending upon whether said output frequency is too high, too low, or at phase lock;
   c) accumulatively summing said digital plus one; said digital minus one, or said digital zero, at a clock frequency; and
   d) said accumulative summing step comprises recalling, parallel adding, and storing said digital plus one, said digital minus one, or said digital zero at said clock frequency.

38. A phase-locked oscillator which comprises:
   a phase-locked loop that includes both a forward path and a feedback path;
   a phase comparator that interconnects said forward path and said feedback path;
   a voltage-controlled oscillator that is interposed into said forward path;
   a parallel adder that is interposed into said forward path intermediate of said phase comparator and said voltage-controlled oscillator; and
   a digital integrator that is connected to said phase comparator and to said voltage-controlled oscillator, and that comprises a RAM and said parallel adder.

39. A phase-locked oscillator as claimed in claim 38 in which said phase-locked oscillator further comprises a pulse decoder that is interposed into said forward path intermediate of said phase comparator and said parallel adder.

40. A phase-locked oscillator as claimed in claim 38 in which said phase-locked oscillator further comprises:
   a pulse decoder that is interposed into said forward path intermediate of said phase comparator and said parallel adder; and
   a digital-to-analog converter that is interposed into said forward path intermediate of said parallel adder and said voltage-controlled oscillator.

41. A phase-locked oscillator as claimed in claim 38 in which said phase-locked oscillator further comprises a digital-to-analog converter that interposed into said forward path intermediate of said phase comparator and said voltage-controlled oscillator.

42. A phase-locked oscillator as claimed in claim 38 in which:
   said phase-locked oscillator further comprises a digital-to-analog converter that is interposed into said forward path intermediate of said phase comparator and said voltage-controlled oscillator; and
   said digital-to-analog converter comprises means for preventing holes in an output voltage thereof.

43. A phase-locked oscillator as claimed in claim 38 in which:
   said phase-locked oscillator further comprises a digital-to-analog converter that includes a plurality of bits, and that is interposed into said forward path intermediate of said phase comparator and said voltage-controlled oscillator; and
   said digital-to-analog converter comprises means for making output voltages of each of plurality of adjacent ones of said bits less than twice those produced by respective lower ones of said bits, irrespective of component tolerances.

44. A phase-locked oscillator as claimed in claim 38 in which said digital integrator includes a lead compensator, comprising a pulse decoder that is disposed outside of said forward path, and that is connected between said phase comparator and said voltage-controlled oscillator.

45. A phase-locked oscillator as claimed in claim 38 in which:
   said digital integrator includes a first pulse decoder that is interposed into said forward path intermediate of said phase comparator and said parallel adder; and said digital integrator includes a lead compensator, comprising a second pulse decoder that is disposed outside said forward path, and that is connected to said phase comparator.

46. A phase-locked oscillator as claimed in claim 38 in which:

said phase comparator includes UP and DOWN output conductors; and said phase-locked oscillator includes means, being connected to said UP and DOWN output conductors and to said voltage-controlled oscillator, for converting UP and DOWN signals into two different lead-compensating voltages.

47. A phase-locked oscillator as claimed in claim 38 in which:

said phase comparator includeds UP and DOWN output conductors;

said phase-locked oscillator includes a lead compensator;

said lead compensator comprises an inverter and a resistor that are connected in series with said UP and DOWN output conductors;

said resistor comprises a center tap; and said lead compensator further comprises connection of said center tap to said voltage-controlled oscillator.

48. A phase-locked oscillator as claimed in claim 38 in which:

said digital integrator includes a lead compensator; and said lead compensator comprises a second parallel adder that is disposed in said forward path intermediate of said phase comparator and said voltage-controlled oscillator.

49. A phase-locked oscillator as claimed in claim 38 in which:

said digital integrator includes a pulse decoder that is interposed into said forward path intermediate of said phase comparator and said parallel adder;

said digital integrator further comprises a lead compensator; and said lead compensator comprises a second parallel adder that is interposed into said forward path intermediate of the first said parallel adder and said voltage-controlled oscillator.

50. A phase-locked oscillator which comprises:

a phase-locked loop that includes both a forward path and a feedback path;

a phase comparator that interconnects said forward path and said feedback path;

a voltage-controlled oscillator that is interposed into said forward path;

an integrator that is connected to said phase comparator and said voltage-controlled oscillator; and said integrator comprises means for accumulatively summing a plus one, a minus one, and/or a zero at a clock frequency.

51. A phase-locked oscillator as claimed in claim 50 in which said integrator, and said means for accumulatively summing, comprises a RAM and a parallel adder.

52. A phase-locked oscillator as claimed in claim 50 in which said phase-locked oscillator includes means for offsetting an output frequency of said voltage-controlled oscillator in a leading direction.

53. A phase-locked oscillator as claimed in claim 50 in which said phase-locked oscillator includes means, comprising a decoder, for offsetting an output frequency of said voltage-controlled oscillator in a leading direction.

54. A phase-locked oscillator which comprises:

a phase-locked loop that includes both a forward path and a feedback path, and that operates at a loop frequency;

a phase comparator that interconnects said forward path and said feedback path;

a voltage-controlled oscillator that is interposed into said forward path;

an integrator that is connected to said phase comparator and said voltage-controlled oscillator; and said integrator comprises means for accumulatively summing a plus one, a minus one, and/or a zero at a frequency that exceeds said loop frequency.

55. A phase-locked oscillator as claimed in claim 54 in which said phase-locked oscillator includes means, comprising a decoder, for offsetting an output frequency of said voltage-controlled oscillator in a leading direction.

* * * * *